United States Patent
Yokogawa et al.

(10) Patent No.: US 8,729,579 B2
(45) Date of Patent: May 20, 2014

(54) NITRIDE-BASED SEMICONDUCTOR LIGHT-EMITTING ELEMENT, LIGHTING DEVICE, LIQUID CRYSTAL DISPLAY DEVICE, AND METHOD FOR PRODUCING LIGHTING DEVICE

(75) Inventors: Toshiya Yokogawa, Nara (JP); Akira Inoue, Osaka (JP); Masaki Fujikane, Osaka (JP); Mitsuaki Oya, Osaka (JP); Atsushi Yamada, Osaka (JP); Tadashi Yano, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/432,022

(22) Filed: Mar. 28, 2012

(65) Prior Publication Data

US 2012/0182495 A1 Jul. 19, 2012

Related U.S. Application Data

(63) Continuation of application No. PCT/JP2010/007117, filed on Dec. 7, 2010.

(30) Foreign Application Priority Data

Dec. 9, 2009 (JP) ................................. 2009-279358

(51) Int. Cl.
*H01L 33/00* (2010.01)

(52) U.S. Cl.
USPC .......... 257/96; 257/13; 257/98; 257/E33.008; 257/E33.012; 349/61; 438/28; 438/47; 372/44.011; 372/50.121

(58) Field of Classification Search
USPC .............. 257/79–103, E33.001–E33.055, 13, 257/E33.008, E33.012; 438/22–47; 349/61; 372/43.01, 44.01–50.1, 50.121
See application file for complete search history.

(56) References Cited

U.S. PATENT DOCUMENTS

| 6,337,536 B1 | 1/2002 | Matsubara et al. |
| 6,613,461 B1 | 9/2003 | Sugahara |

(Continued)

FOREIGN PATENT DOCUMENTS

| JP | 05-166923 A | 7/1993 |
| JP | 07-169715 A | 7/1995 |

(Continued)

OTHER PUBLICATIONS

Hisachi Masui et al., Optical polarization characteristics of InGaN/GaN light-emitting diodes fabricated on GaN substrates oriented between (1010) and (1011) planes, published Mar. 4, 2008, Applied Physics Letters, vol. 92, No. 091105, all pages.*

(Continued)

*Primary Examiner* — Fernando L. Toledo
*Assistant Examiner* — Victoria K Hall
(74) *Attorney, Agent, or Firm* — Renner, Otto, Boisselle & Sklar, LLP

(57) ABSTRACT

An illuminating device includes at least first and second nitride-based semiconductor light-emitting elements each having a semiconductor chip with an active layer region. The active layer region is at an angle of 1° or more with an m plane, and an angle formed by a normal line of a principal surface in the active layer region and a normal line of the m plane is 1° or more and 5° or less. The first and second nitride-based semiconductor light-emitting elements have thicknesses of d1 and d2, respectively, and emit the polarized light having wavelengths λ1 and λ2, respectively, where the inequalities of λ1<λ2 and d1<d2 are satisfied.

23 Claims, 14 Drawing Sheets

(56) References Cited

U.S. PATENT DOCUMENTS

| | | | |
|---|---|---|---|
| 6,967,359 B2* | 11/2005 | Kamiyama et al. | 257/190 |
| 2002/0024053 A1 | 2/2002 | Inoue et al. | |
| 2003/0156077 A1* | 8/2003 | Balogh | 345/6 |
| 2004/0156130 A1* | 8/2004 | Powell et al. | 359/845 |
| 2006/0284206 A1 | 12/2006 | Masui et al. | |
| 2007/0070616 A1 | 3/2007 | Segawa | |
| 2008/0023835 A1* | 1/2008 | Tsai et al. | 257/741 |
| 2008/0225202 A1* | 9/2008 | Joo et al. | 349/64 |
| 2008/0230766 A1 | 9/2008 | Okamoto et al. | |
| 2009/0050917 A1 | 2/2009 | Nakagawa et al. | |
| 2009/0050928 A1* | 2/2009 | Fujikura | 257/103 |
| 2009/0065798 A1 | 3/2009 | Masui et al. | |
| 2009/0085043 A1* | 4/2009 | Song et al. | 257/76 |
| 2010/0032644 A1 | 2/2010 | Akita et al. | |

FOREIGN PATENT DOCUMENTS

| | | | | |
|---|---|---|---|---|
| JP | 11-145513 A | | 5/1999 | |
| JP | 2000-150960 A | | 5/2000 | |
| JP | 2001-168388 A | | 6/2001 | |
| JP | 2001-308462 A | | 11/2001 | |
| JP | 2003-332697 A | | 11/2003 | |
| JP | 2007-115663 A | | 5/2007 | |
| JP | 2007-142484 A | | 6/2007 | |
| JP | 2008-159606 A | | 7/2008 | |
| JP | 2008-198952 A | | 8/2008 | |
| JP | 2008-218645 | * | 9/2008 | H01L 33/00 |
| JP | 2008-218645 A | | 9/2008 | |
| JP | 2008-235804 A | | 10/2008 | |
| JP | 2008-305962 A | | 12/2008 | |
| JP | 2008-544552 A | | 12/2008 | |
| JP | 2009-021349 A | | 1/2009 | |
| JP | 2009-021643 A | | 1/2009 | |
| JP | 2009-044067 A | | 2/2009 | |
| JP | 2009-049209 A | | 3/2009 | |
| JP | 2009-070893 A | | 4/2009 | |
| JP | 2009-111012 A | | 5/2009 | |

OTHER PUBLICATIONS

Co-pending U.S. Appl. No. 13/256,529, filed Sep. 14, 2011.
International Search Report for corresponding International Application No. PCT/JP2010/007117 mailed Jan. 11, 2011.
Form PCT/IPEA/408 for corresponding International Application No. PCT/JP2010/007117 dated Dec. 13, 2011 and partial English translation.
Form PCT/ISA/237 for corresponding International Application No. PCT/JP2010/007117 dated Jan. 11, 2011 with partial English translation.
International Search Report for related International Application No. PCT/JP2009/003215 mailed Aug. 11, 2009.
Masui et al., "Optical polarization characteristics of InGaN/GaN light-emitting diodes fabricated on GaN substrates oriented between (1010) and (1011) planes", Applied Physics Letters 92, (2008), pp. 0911051-3 (cited in [0013] of the specification).
Masui et al., "Optical polarization characteristics of $m$-oriented InGaN/GaN light-emitting diodes with various indium compositions in single-quantum-well structure", J. Phys. D: Applied Physics, 2008, vol. 4, No. 22, pp. 225104.1-225104.7.
Notification of Reasons for Refusal for related Japanese Application No. 2010-522114 which is a national phase application of PCT/JP2009/003215 and a full English translation.

* cited by examiner

FIG.2
(a)
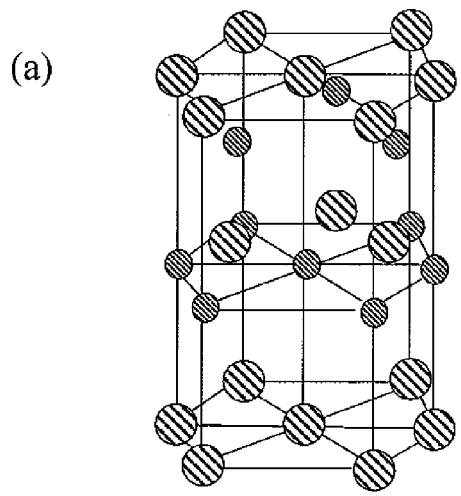
- N
- Ga
(b)
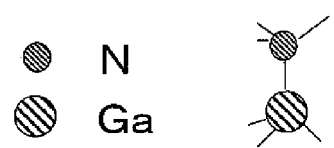
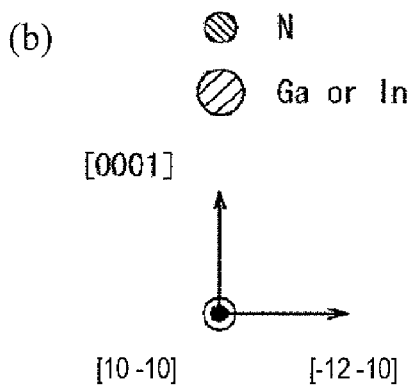
c PLANE
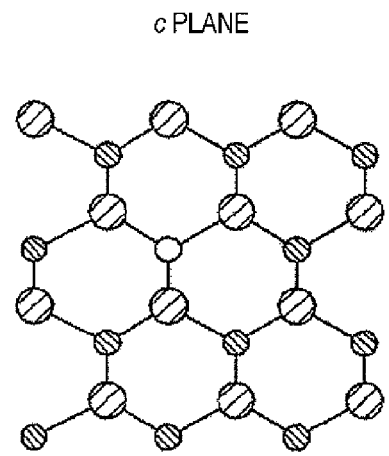
(c)
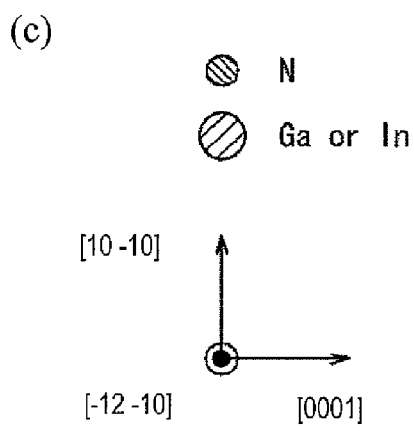
m PLANE
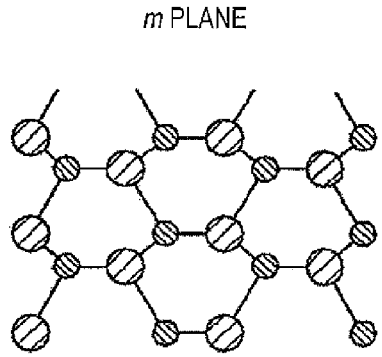

FIG. 7
(a)
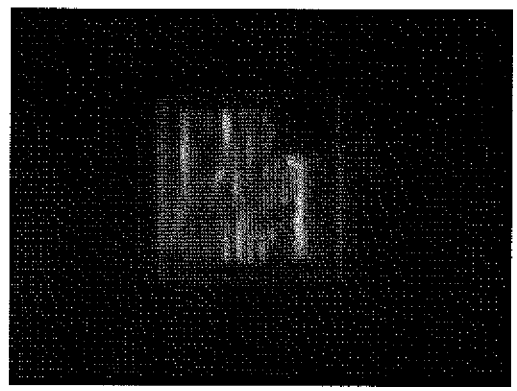
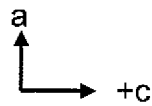
(b)
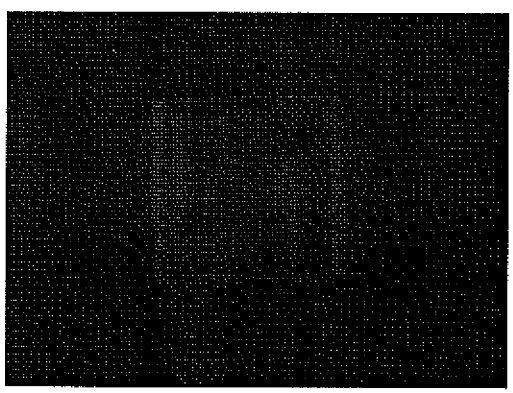
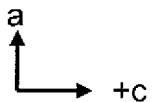

FIG.13
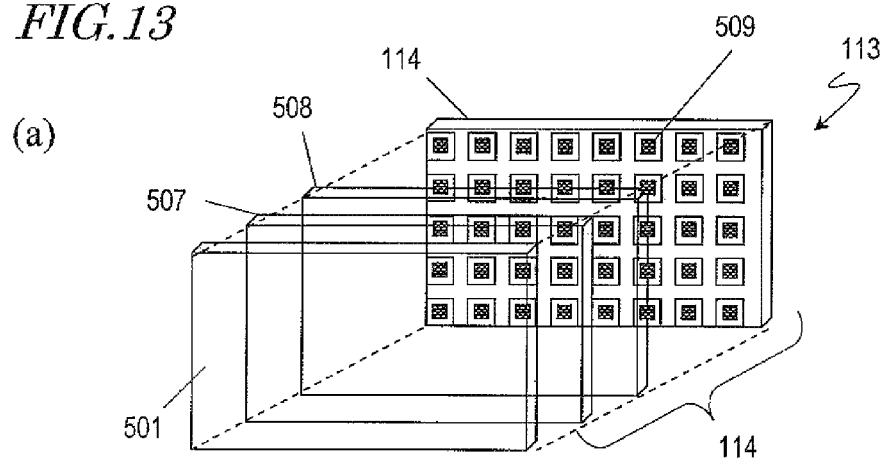
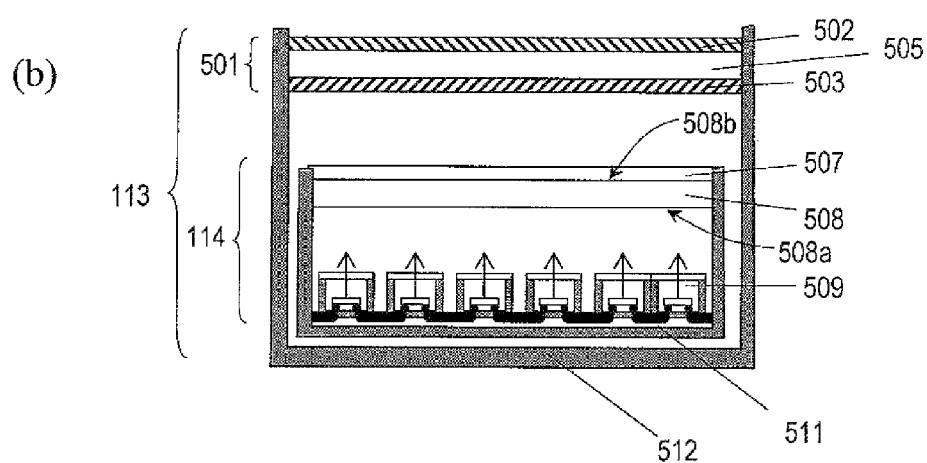
FIG.14
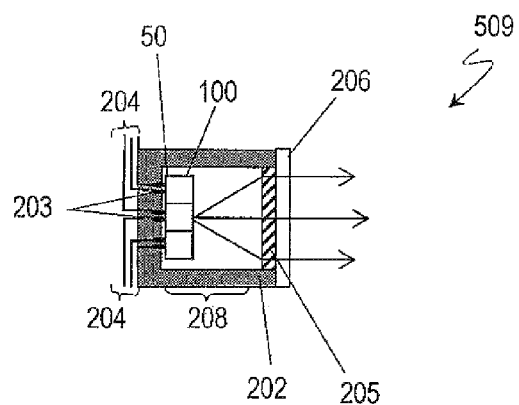

FIG.15
(a)
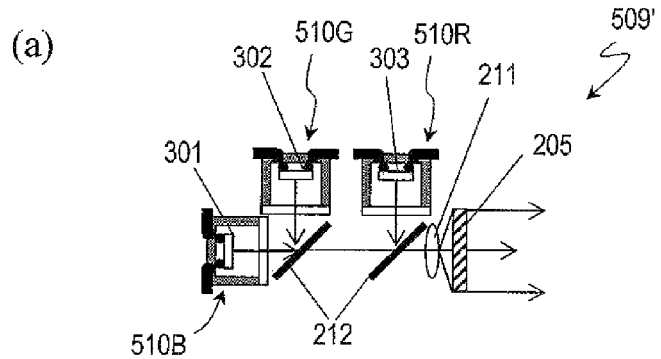
(b)
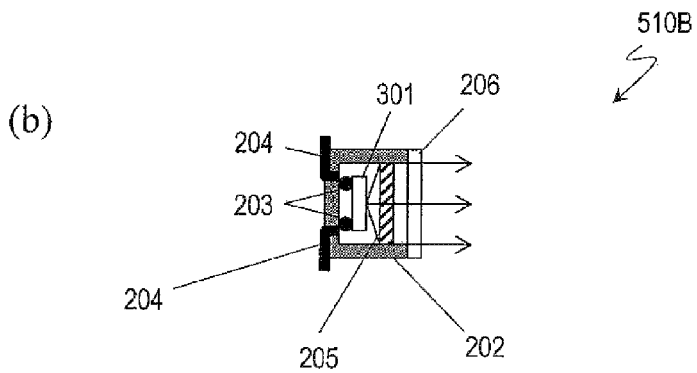
FIG.16
(a)
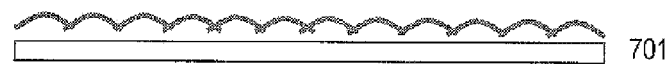
(b)

(a)

(b)

FIG.21
(a)
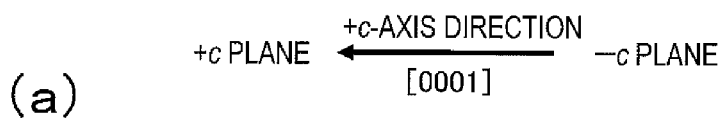
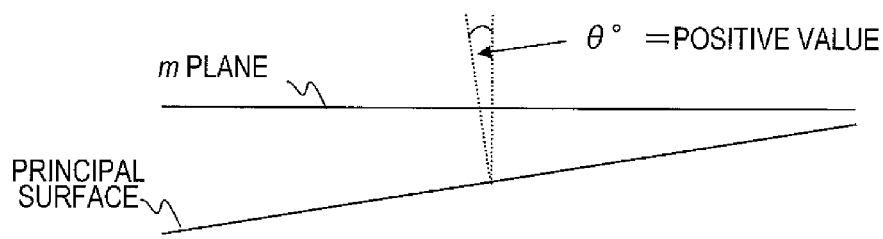
(b)
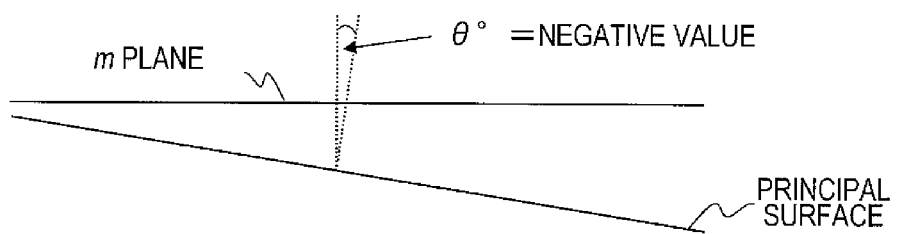

NITRIDE-BASED SEMICONDUCTOR LIGHT-EMITTING ELEMENT, LIGHTING DEVICE, LIQUID CRYSTAL DISPLAY DEVICE, AND METHOD FOR PRODUCING LIGHTING DEVICE

This is a continuation of International Application No. PCT/JP2010/007117, with an international filing date of Dec. 7, 2010, which claims priority of Japanese Patent Application No. 2009-279358, filed on Dec. 9, 2009, the contents of which are hereby incorporated by reference.

BACKGROUND

1. Technical Field

The present disclosure relates to a nitride-based semiconductor light-emitting element, an illuminating device, and a liquid crystal display device. More particularly, the present disclosure relates to a GaN-based semiconductor light-emitting element, such as a light-emitting diode or a laser diode, capable of emitting blue light, green light, orange light, red light, or light of any wavelength that is selected from the entire visible light range, and to an illuminating device and a liquid crystal display device that uses the GaN-based semiconductor light-emitting element and the illuminating device.

2. Description of the Related Art

Nitride semiconductors which contain nitrogen (N) as a group V element are a promising material for short-wavelength light-emitting elements because of their band gap sizes. Of the nitride semiconductors, gallium nitride-based compound semiconductors, in particular, are being actively studied, and have been put into practical use in the form of blue light-emitting diodes (LEDs), green LEDs, and semiconductor lasers that use a GaN-based semiconductor as a material (see, for example, Japanese Patent Application Laid-Open Publication Nos. 2001-308462 and No. 2003-332697which are referred to as JP2001-308462 and JP2003-332697, respectively).

Hereinafter, gallium nitride-based compound semiconductors are referred to as GaN-based semiconductors. GaN-based semiconductors include compound semiconductors that substitute at least one of aluminum (Al) and indium (In) for some or all of Ga atoms, and GaN-based semiconductors are expressed by a composition formula of $Al_xGa_yIn_zN$ ($0 \leq x, y, z \leq 1$, $x+y+z=1$).

Substituting Al or In for Ga may make the band gap larger or smaller than that of GaN. In this manner, not only GaN-based semiconductor elements that emit short-wavelength light such as blue light or green light but also GaN-based semiconductor elements that emit orange light or red light are obtained. A light-emitting element that emits light of any wavelength selected from the entire visible light range is therefore theoretically possible with the use of a GaN-based semiconductor, and the application of GaN-based semiconductor light-emitting elements to image display devices and illuminating devices is expected.

GaN-based semiconductors have a wurtzite crystal structure. FIG. 1 illustrates planes of the wurtzite crystal structure expressed in four-digit indices (hexagonal indices). Four-digit indices use basis vectors denoted by a1, a2, a3, and c to express crystal planes and orientations. The basis vector c runs in a [0001] direction, which is called "c axis". A plane perpendicular to the c axis is called as "c plane" or "(0001) plane". The "c axis" and the "c plane" are sometimes written as "C axis" and "C plane", respectively. FIG. 2(a) illustrates the crystal structure of a GaN-based semiconductor in the form of a ball-stick model. FIG. 2(b) illustrates the positions of Ga and N of the GaN-based semiconductor crystal on a plane perpendicular to the c axis.

Conventionally, when manufacturing a semiconductor element from a GaN-based semiconductor, a c-plane substrate, i.e., a substrate having a (0001) plane as a surface is used as a substrate on which a GaN-based semiconductor crystal is to be grown. As is understood from FIGS. 2(a) and 2(b), a layer in which Ga atoms alone are arranged and a layer in which N atoms alone are arranged are formed in the c-axis direction in this case. Because of this arrangement of Ga atoms and N atoms, spontaneous electrical polarization occurs in the GaN-based semiconductor. The "c plane" is therefore also called as "polarity plane".

Consequently, a piezo-electric field is generated along the c-axis direction in a quantum well of InGaN in an active layer of the GaN-based semiconductor light-emitting element, and shifts the distribution of electrons and holes within the active layer, thereby lowering the internal quantum efficiency of the active layer through quantum-confined Stark effect of carriers. The result is an increase in threshold current in the case of a semiconductor laser, and an increase in power consumption and a drop in luminous efficacy in the case of an LED. Further, a rise in injected-carrier density is followed by the screening of the piezo-electric field and a change in light emission wavelength.

If the In composition of the InGaN active layer is increased in order to make the semiconductor element emit green light, or light in the long-wavelength range such as orange light and red light, the intensity of the piezo-electric field increases even more along with the In composition and the internal quantum efficiency drops rapidly. It is therefore a general opinion that an LED using an InGaN active layer that has a c plane can only emit light whose wavelength is up to 550 nm or so.

As a solution to this problem, the use of a substrate having as its surface an m plane which is a non-polarity plane (an m-plane GaN-based substrate) has been considered in the manufacture of a light-emitting element. As illustrated in FIG. 1, m planes in the wurtzite crystal structure are parallel to the c axis and are six equivalent planes orthogonal to the c planes. For instance, a (10-10) plane hatched in FIG. 1 which is perpendicular to a [10-10] direction is an m plane. Other m planes equivalent to the (10-10) plane include a (−1010) plane, a (1-100) plane, a (−1100) plane, a (01-10) plane, and a (0-110) plane. The sign "−" to the left of a number inside the parentheses that indicates a Miller index means a "bar".

FIG. 2(c) illustrates the positions of Ga and N of the GaN-based semiconductor crystal on a plane perpendicular to an m plane. Ga atoms and nitrogen atoms on an m plane exist on the same atomic plane as illustrated in FIG. 2(c) and, therefore, electrical polarization does not occur in a direction perpendicular to the m plane. Accordingly, using a semiconductor multilayer structure that is formed on an m plane in the manufacture of a light-emitting element prevents the generation of a piezo-electric field in the active layer, thereby solving the problem described above.

The solution also allows the In composition of the active layer to increase greatly, and thus makes it possible to produce an LED or a laser diode that emits light having a longer wavelength than blue light, such as green light, orange light, or red light, from the same material base that is used for a blue-light LED or laser diode.

Herein, an epitaxial growth in a direction perpendicular to an X plane (X=c, m) of a hexagonal crystal wurtzite structure is expressed as "X-plane growth". In X-plane growth, the X plane is referred to as "growth plane" and a semiconductor layer formed through X-plane growth is referred to as "X-plane semiconductor layer".

As disclosed in APPLIED PHYSICS LETTERS 92 (2008) 091105 and others, an LED that uses an InGaN active layer formed on an m plane has optical polarization characteristics originated from the structure of its valence band. Specifically, the LED emits light that is polarized in a direction parallel to an a axis.

The LED is therefore expected to be used as a light-emitting element that can emit light having optical polarization characteristics. For instance, liquid crystal display devices which utilize the function of controlling the optical polarization direction of a liquid crystal need to use polarized light as a light source. In conventional liquid crystal display devices, there is no appropriate light source for emitting light that has optical polarization characteristics, and an LED, a cold cathode fluorescent lamp (CCFL), or a similar light source is thus arranged such that emitted light passes through a polarizing plate to obtain light that has optical polarization characteristics. However, this structure has a problem in that the polarizing plate blocks most of the light emitted from the light source and consequently lowers the light utilization efficiency. The LED that uses an InGaN active layer formed on an m plane, when employed as the light source of a liquid crystal display device, improves the light utilization efficiency, greatly reduces the power consumption of the liquid crystal display device, and eliminates the need for a polarizing plate, which lowers manufacturing cost.

SUMMARY

As described above, a GaN-based semiconductor element grown on an m-plane substrate can have a markedly superior effect to that of a GaN-based semiconductor element grown on a c-plane substrate. There is a drawback, however, that a GaN-based semiconductor element grown on an m-plane substrate is inferior in mechanical strength to a GaN-based semiconductor element grown on a c-plane substrate. This presents a technical obstacle to the practical application of GaN-based semiconductor elements grown on an m-plane substrate.

In view of the above, one non-limiting and exemplary embodiment provides a structure having excellent optical polarization characteristics and being capable of improving the physical strength of a GaN-based semiconductor element that is made from crystals grown on a plane substrate, and provides an illuminating device and a liquid crystal display device that use the structure.

In one general aspect, the techniques disclosed here feature an illuminating device including at least a first nitride-based semiconductor light-emitting element and a second nitride-based semiconductor light-emitting element, in which: the first nitride-based semiconductor light-emitting element and the second nitride-based semiconductor light-emitting element each include a semiconductor chip; the semiconductor chip includes a nitride-based semiconductor multilayer structure formed from an $Al_xIn_yGa_zN$ (x+y+z=1, x≥0, y≥0, z≥0) semiconductor, and the nitride-based semiconductor multilayer structure includes an active layer region formed from a nitride semiconductor layer; the active layer region is at an angle of 1° or more with an m plane, and an angle formed by a normal line of a principal surface in the active layer region and a normal line of the m plane is 1° or more and 5° or less; the first nitride-based semiconductor light-emitting element and the second nitride-based semiconductor light-emitting element each emit polarized light from the active layer region; and, when the polarized light emitted from the first nitride-based semiconductor light-emitting element and the polarized light emitted from the second nitride-based semiconductor light-emitting element have wavelengths $\lambda 1$ and $\lambda 2$, respectively, and thicknesses of the semiconductor chips of the first nitride-based semiconductor light-emitting element and the second nitride-based semiconductor light-emitting element are given as d1 and d2, respectively, the following relations are satisfied: $\lambda 1 < \lambda 2$; and d1<d2.

These general and specific aspects may be implemented using a system, a method, and a computer program, and any combination of systems, methods, and computer programs.

According to the nitride-based semiconductor light-emitting element disclosed in the present application, the active layer region is provided in which the angle formed by the normal line of the principal surface and the normal line of the m plane is 1° or more and 5° or less, and the semiconductor chip is set to a given thickness which is determined by the light emission wavelength. The nitride-based semiconductor light-emitting element can therefore emit light having excellent optical polarization characteristics, and is improved in the mechanical strength of the semiconductor chip.

According to the illuminating device disclosed in the present application which includes two or more nitride-based semiconductor light-emitting elements, when the light emission wavelengths of two nitride-based semiconductor light-emitting elements 100 are given as $\lambda 1$ and $\lambda 2$ and the thicknesses of the elements' semiconductor chips are given as d1 and d2, relations of $\lambda 1 < \lambda 2$ and d1<d2 are satisfied. The illuminating device can thus emit light having excellent optical polarization characteristics, and is improved in the mechanical strength of the semiconductor chips.

With this illuminating device, a highly efficient low-cost liquid crystal display device is realized which makes use of optical polarization characteristics.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 2(*a*) is a perspective view schematically illustrating a unit cell of GaN, and FIGS. 2(*b*) and 2(*c*) are diagrams illustrating the crystal structure of a c plane and the crystal structure of an m plane, respectively.

FIGS. 7(*a*) and 7(*b*) are chip photographs of the nitride-based semiconductor light-emitting element according to one embodiment of the present disclosure which were taken with a camera when a polarizing plate is set to an angle of 0 degrees (FIG. 7(*a*)) and to an angle of 90 degrees (FIG. 7(*b*)).

FIGS. 13(*a*) and 13(*b*) are respectively a schematic perspective view and sectional view of a liquid crystal display device according to another embodiment of the present disclosure.

FIG. 14 is a schematic sectional view illustrating an illumination unit which is to be used in an illuminating device of the liquid crystal display device of FIG. 13.

FIGS. 15(*a*) and 15(*b*) are schematic sectional views illustrating another example of the illumination unit which is to be used in the illuminating device of the liquid crystal display device of FIG. 13.

FIGS. 16(*a*) and 16(*b*) are schematic diagrams illustrating examples of an optical plate which is to be used in the illuminating device of the liquid crystal display device of FIG. 13.

FIGS. 21(*a*) and 21(*b*) are each a sectional view illustrating a relation between the principal surface of a GaN-based compound semiconductor layer and an m plane.

DETAILED DESCRIPTION

Figure 1:
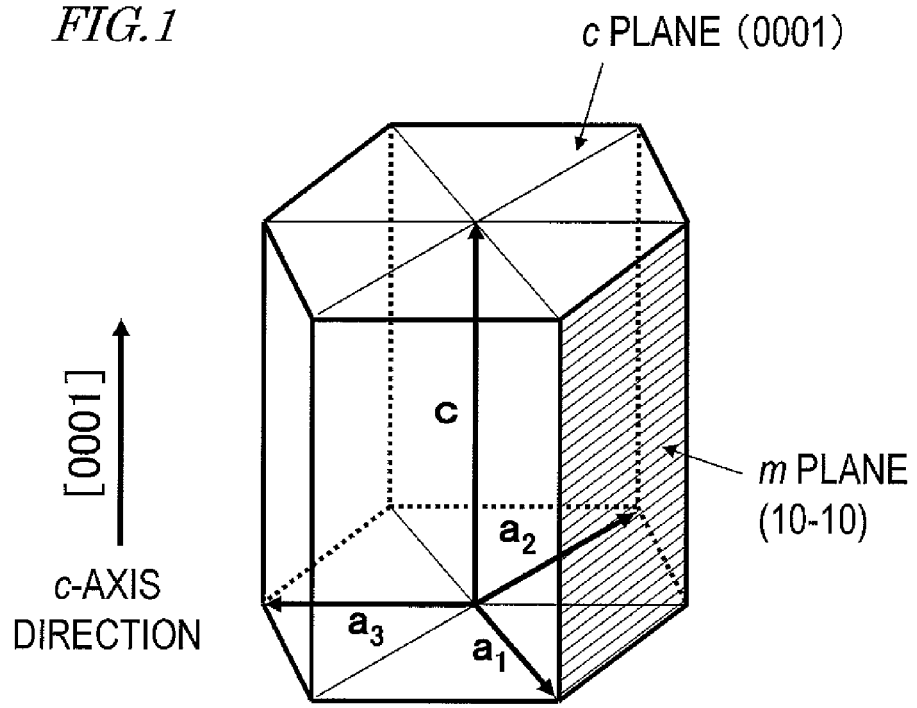
FIG. 1 is a perspective view illustrating basis vectors $a_1$, $a_2$, $a_3$ and c of a wurtzite crystal structure.

An illuminating device according to the present disclosure includes at least a first nitride-based semiconductor light-emitting element and a second nitride-based semiconductor light-emitting element, in which: the first nitride-based semiconductor light-emitting element and the second nitride-based semiconductor light-emitting element each include a semiconductor chip; the semiconductor chip includes a nitride-based semiconductor multilayer structure formed from an $Al_xIn_yGa_zN$ (x+y+z=1, x≥0, y≥0, z≥0) semiconductor, and the nitride-based semiconductor multilayer structure includes an active layer region formed from a nitride semiconductor layer; the active layer region is at an angle of 1° or more with an m plane, and an angle formed by a normal line of a principal surface in the active layer region and a normal line of the m plane is 1° or more and 5° or less; the first nitride-based semiconductor light-emitting element and the second nitride-based semiconductor light-emitting element each emit polarized light from the active layer region; and, when the polarized light emitted from the first nitride-based semiconductor light-emitting element and the polarized light emitted from the second nitride-based semiconductor light-emitting element have wavelengths $\lambda 1$ and $\lambda 2$, respectively, and thicknesses of the semiconductor chips of the first nitride-based semiconductor light-emitting element and the second nitride-based semiconductor light-emitting element are given as d1 and d2, respectively, the following relations are satisfied: $\lambda 1 < \lambda 2$; and d1<d2.

In an embodiment, the active layer region is slanted in a c-axis direction or an a-axis direction.

In an embodiment, the illuminating device further includes a third nitride-based semiconductor light-emitting element which includes the semiconductor chip, and, when the third nitride-based semiconductor light-emitting element emits polarized light that has a wavelength of $\lambda 3$ and has a semiconductor chip thickness of d3, the following relations are satisfied: $\lambda 1 < \lambda 2 < \lambda 3$; and d1<d2<d3.

In an embodiment, the polarized light emitted from the first nitride-based semiconductor light-emitting element, the polarized light emitted from the second nitride-based semiconductor light-emitting element, and the polarized light emitted from the third nitride-based semiconductor light-emitting element have the same optical polarization direction.

In an embodiment, the illuminating device further includes a support substrate, and the first nitride-based semiconductor light-emitting element, the second nitride-based semiconductor light-emitting element, and the third nitride-based semiconductor light-emitting element are supported on the support substrate.

In an embodiment, the wavelengths $\lambda 1$, $\lambda 2$, and $\lambda 3$ are a blue-range wavelength, a green-range wavelength, and a red-range wavelength, respectively.

In an embodiment, the wavelengths $\lambda 1$, $\lambda 2$, and $\lambda 3$ are 420 nm or more and 470 nm or less, 520 nm or more and 560 nm or less, and 590 nm or more and 660 nm or less, respectively.

In an embodiment, the semiconductor chip thicknesses d1, d2, and d3 are 110 μm or more and 150 μm or less, 200 μm or more and 240 μm or less, and 250 μm or more and 290 μm or less, respectively.

In an embodiment, the illuminating device further includes: an AlGaInP-based light-emitting element; and a polarizing filter provided in a place that allows the polarizing filter to transmit light emitted from the AlGaInP-based light-emitting element, and the wavelengths $\lambda 1$ and $\lambda 2$ are a blue-range wavelength and a green-range wavelength, respectively.

In an embodiment, the semiconductor chip thicknesses d1 and d2 are 110 μm or more and 150 μm or less and 200 μm or more and 240 μm or less, respectively.

In an embodiment, the wavelengths $\lambda 1$ and $\lambda 2$ are 420 nm or more and 470 nm or less and 520 nm or more and 560 nm or less, respectively.

In an embodiment, the first nitride-based semiconductor light-emitting element and the second nitride-based semiconductor light-emitting element each include a p-type electrode which is provided in a part of the nitride-based semiconductor multilayer structure and which is formed from Mg or a Mg alloy.

In an embodiment, the illuminating device further includes a pair of optical lenses which respectively collect the polarized light emitted from the first nitride-based semiconductor light-emitting element and the polarized light emitted from the second nitride-based semiconductor light-emitting element.

In an embodiment, the illuminating device further includes an optical lens which collects in common the polarized light emitted from the first nitride-based semiconductor light-emitting element and the polarized light emitted from the second nitride-based semiconductor light-emitting element.

In an embodiment, the pair of optical lenses or the optical lens collimates light beams emitted from the nitride-based semiconductor light-emitting elements into parallel beams.

In an embodiment, the first nitride-based semiconductor light-emitting element and the second nitride-based semiconductor light-emitting element each have a light emission face positioned near a focal point of the optical lens.

In an embodiment, the illuminating device further includes: an optical sheet; and an optical plate.

A liquid crystal display device according to the present disclosure includes: a liquid crystal panel; and the above-mentioned illuminating device.

A nitride-based semiconductor light-emitting element according to the present disclosure includes a semiconductor chip, in which: the semiconductor chip includes a nitride-based semiconductor multilayer structure formed from an $Al_xIn_yGa_zN$ ($x+y+z=1$, $x\geq0$, $y\geq0$, $z\geq0$) semiconductor, and the nitride-based semiconductor multilayer structure includes an active layer region formed from a nitride semiconductor layer; the active layer region is at an angle of 1° or more with an m plane, and an angle formed by a normal line of a principal surface in the active layer region and a normal line of the m plane is 1° or more and 5° or less; the active layer region emits polarized light having a wavelength of 420 nm or more and 470 nm or less; and the semiconductor chip has a thickness of 110 μm or more and 150 μm or less.

A nitride-based semiconductor light-emitting element according to the present disclosure includes a semiconductor chip, in which: the semiconductor chip includes a nitride-based semiconductor multilayer structure formed from an $Al_xIn_yGa_zN$ ($x+y+z=1$, $x\geq0$, $y\geq0$, $z\geq0$) semiconductor, and the nitride-based semiconductor multilayer structure includes an active layer region formed from a nitride semiconductor layer; the active layer region is at an angle of 1° or more with an m plane, and an angle formed by a normal line of a principal surface in the active layer region and a normal line of the m plane is 1° or more and 5° or less; the active layer region emits polarized light having a wavelength of 520 nm or more and 560 nm or less; and the semiconductor chip has a thickness of 200 μm or more and 240 μm or less.

A nitride-based semiconductor light-emitting element according to the present disclosure includes a semiconductor chip, in which: the semiconductor chip includes a nitride-based semiconductor multilayer structure formed from an $Al_xIn_yGa_zN$ ($x+y+z=1$, $x\geq0$, $y\geq0$, $z\geq0$) semiconductor, and the nitride-based semiconductor multilayer structure includes an active layer region formed from a nitride semiconductor layer; the active layer region is at an angle of 1° or more with an m plane, and an angle formed by a normal line of a principal surface in the active layer region and a normal line of the m plane is 1° or more and 5° or less; the active layer region emits polarized light having a wavelength of 590 nm or more and 660 nm or less; and the semiconductor chip has a thickness of 250 μm or more and 290 μm or less.

A method of manufacturing an illuminating device according to the present disclosure, which includes at least a first nitride-based semiconductor light-emitting element and a second nitride-based semiconductor light-emitting element, includes the steps of: (A) manufacturing the first nitride-based semiconductor light-emitting element and the second nitride-based semiconductor light-emitting element, which differ from each other in light emission wavelength and in semiconductor chip thickness, the step (A) including the steps of: (a) preparing a substrate; (b) forming on the substrate a nitride-based semiconductor multilayer structure, which includes an active layer region formed from an m-plane nitride semiconductor layer and which is formed from an $Al_xIn_yGa_zN$ ($x+y+z=1$, $x\geq0$, $y\geq0$, $z\geq0$) semiconductor, and slanting the active layer region from an m plane by an angle of 1° or more so that an angle formed by a normal line of a principal surface in the active layer region and a normal line of the m plane is 1° or more and 5° or less; (c) forming an electrode in the nitride-based semiconductor multilayer structure to produce a semiconductor chip that emits polarized light from the active layer region; and (d) adjusting the semiconductor chip to a thickness that is determined by a wavelength of the polarized light emitted from the active layer region; and (B) disposing the first nitride-based semiconductor light-emitting element and the second nitride-based semiconductor light-emitting element on a support substrate, in which, in the step (d) of the step (A), when polarized light emitted from the first nitride-based semiconductor light-emitting element and polarized light emitted from the second nitride-based semiconductor light-emitting element have wavelengths $\lambda 1$ and $\lambda 2$, respectively, and thicknesses of the semiconductor chips of the first nitride-based semiconductor light-emitting element and the second nitride-based semiconductor light-emitting element are given as d1 and d2, respectively, the thicknesses of the semiconductor chips of the first nitride-based semiconductor light-emitting element and the second nitride-based semiconductor light-emitting element are adjusted in a manner that satisfies the following relations: $\lambda 1 < \lambda 2$; and $d1 < d2$.

In an embodiment, the first nitride-based semiconductor light-emitting element and the second nitride-based semiconductor light-emitting element are disposed on the support substrate so that the polarized light emitted from the first nitride-based semiconductor light-emitting element and the polarized light emitted from the second nitride-based semiconductor light-emitting element have the same optical polarization direction.

The inventors of the present disclosure have conducted a thorough examination of the optical polarization characteristics and mechanical strength of a GaN-based light-emitting element grown on an m plane and, as a result, have found that the optical polarization characteristics and the mechanical strength are dependent on the thickness of a semiconductor chip that is a constituent of the GaN-based light-emitting element and on the wavelength of light emitted from an active layer. Based on the findings, the inventors of the present disclosure have devised a GaN-based light-emitting element that has a semiconductor multilayer structure formed on an m plane and possesses excellent optical polarization characteristics and enough mechanical strength as well by optimizing the thickness of a semiconductor chip in a GaN-based light-emitting element formed on an m plane. Embodiments of the present disclosure are described below with reference to the drawings.

(First Embodiment)

Figure 3:
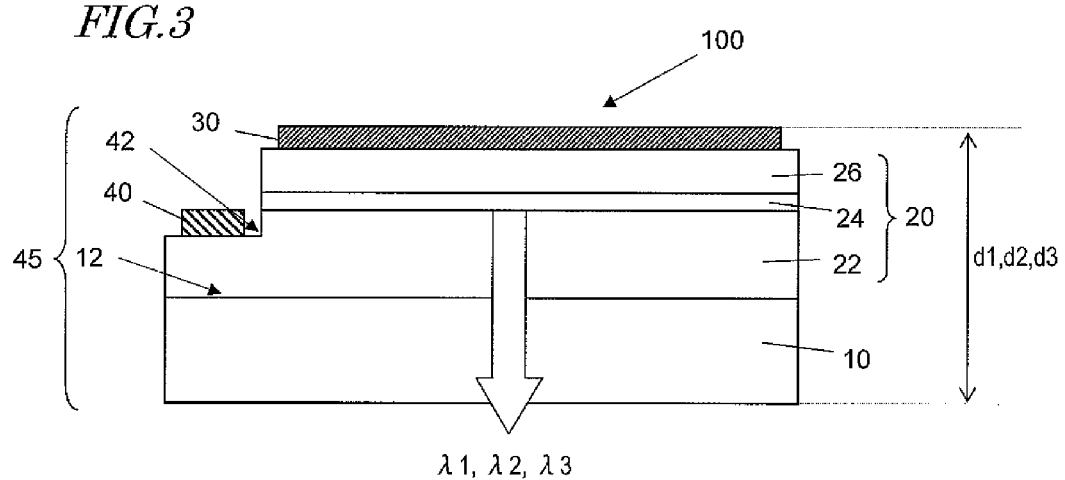
FIG. 3 is a schematic sectional view of a nitride-based semiconductor light-emitting element according to an embodiment of the present disclosure.

Hereinafter, an embodiment of the nitride-based semiconductor light-emitting element and an illuminating device according to the present disclosure is explained in detail with reference to the drawings. FIG. 3 schematically illustrates the sectional structure of a nitride-based semiconductor light-emitting element 100 according to one embodiment of the present disclosure. The nitride-based semiconductor light-emitting element 100 of FIG. 3 is constituted of a semiconductor chip 45.

The semiconductor chip 45 includes a substrate 10 and a nitride-based semiconductor multilayer structure 20, which is formed through epitaxial growth on the substrate 10. The nitride-based semiconductor multilayer structure 20 is formed from a GaN-based semiconductor, more specifically, an $Al_xIn_yGa_zN$ (x+y+z=1, x≥0, y≥0, z≥0) semiconductor. The nitride-based semiconductor multilayer structure 20 also includes an active layer region 24, which functions as a light-emitting region.

An exemplary embodiment uses an active layer region formed on an m plane from a nitride semiconductor layer in order to realize a light-emitting element that has excellent optical polarization characteristics and emits light with high luminous efficacy. This active layer region has a growth direction perpendicular to the m plane (an m-plane nitride semiconductor layer), and is parallel to the m plane. Therefore, in the nitride-based semiconductor light-emitting element 100, the nitride-based semiconductor multilayer structure 20 which includes the active layer region 24 is formed on the substrate 10, which is formed from a GaN-based semiconductor and has an m plane as a surface 12. However, in light of reported cases where a-plane GaN grows on an r-plane sapphire substrate, the surface 12 of the substrate 10 does not always need to be an m plane as long as the active layer region 24 of the nitride-based semiconductor multilayer structure 20 has a crystal orientation parallel to the m plane, in other words, as long as the growth direction of the active layer region is in the m-axis direction.

The surface (principal surface) of the actual m-plane semiconductor layer does not need to be a plane completely parallel to an m plane, and may be slightly at an angle (more than 0 degrees and less than ±1°) with an m plane. Forming a substrate or a semiconductor layer that has a surface completely parallel to an m plane is difficult from the viewpoint of manufacturing technology. When an m-plane substrate or an m-plane semiconductor layer is formed with the current manufacturing technology, the actual surface therefore cannot help but be slanted from the ideal m plane. The angle and direction of the slant vary depending on manufacturing process, and it is difficult to control the angle and direction of the slant of the surface with precision.

In some cases, the surface (principal surface) of a substrate or a semiconductor is intentionally slanted from an m plane by an angle of 1° or more. In a fourth embodiment described below, the surface (principal surface) of the active layer region 24 is intentionally slanted from the m plane by an angle of 1° or more.

The nitride-based semiconductor multilayer structure 20 includes a first conductivity-type semiconductor layer 22 and a second conductivity-type semiconductor layer 26, which are arranged so as to sandwich the active layer region 24. In this embodiment, the first conductivity-type semiconductor layer 22 is positioned on the side of the substrate 10 with respect to the active layer region 24 and the second conductivity-type semiconductor layer 26 is positioned on the side opposite from the substrate 10. An undoped GaN layer may be provided between the active layer region 24 and the second conductivity-type semiconductor layer 26.

The first conductivity-type semiconductor layer 22 is formed from, for example, n-type $Al_uGa_vIn_wN$ (u+v+w=1, u≥0, v≥0, w≥0) and can use, for example, silicon (Si) as an n-type dopant.

The second conductivity-type semiconductor layer 26 is formed from, for example, a p-type $Al_sGa_tN$ (s+t=1, s≥0, t≥0) semiconductor and is doped with, for example, a Mg dopant. Other than Mg, Zn or Be, for example, may be used as a p-type dopant. In the second conductivity-type semiconductor layer 26, an Al composition ratio s may be uniform along the thickness direction, or may be varied continuously or in stages along the thickness direction. Specifically, the second conductivity-type semiconductor layer 26 may have a multi-layer structure in which a plurality of sub-layers different from one another in Al composition ratio s are stacked, and may also have a dopant concentration varied along the thickness direction. The thickness of the second conductivity-type semiconductor layer 26 is 0.2 to 2 μm, for example.

In the case where the top face of the second conductivity-type semiconductor layer 26 serves as the top face of the nitride-based semiconductor multilayer structure 20, it may be possible from the viewpoint of reducing the contact resistance to form a portion of the second conductivity-type semiconductor layer 26 that is near its top face from a semiconductor whose Al composition ratio s is zero, namely, GaN. This GaN portion in this case may contain second conductivity-type impurities at a high concentration, and functions as a contact layer.

Alternatively, the nitride-based semiconductor multilayer structure 20 may include a second conductivity-type GaN layer that is placed on the second conductivity-type semiconductor layer 26. The nitride-based semiconductor multilayer structure 20 may further include a contact layer that is formed from $p^+$-GaN and placed on the second conductivity-type GaN layer.

The active layer region 24 is an electron injection region in the nitride-based semiconductor light-emitting element 100. The active layer region 24 has, for example, a GaInN/GaN multiple quantum well (MQL) structure (having a thickness of 81 nm, for example) in which $Ga_{1-x}In_xN$ well layers (0.14≤x≤0.45) (each having a thickness of 9 nm, for example) and GaN barrier layers (each having a thickness of 9 nm, for example) are stacked alternately. The wavelength of light emitted from the nitride-based semiconductor light-emitting element 100 is determined by the band gap size of the semiconductor that constitutes the active layer region 24, more specifically, by an In composition x in the $Ga_{1-x}In_xN$ semiconductor which is a semiconductor constituent of the well layers. Because a piezo-electric field is not generated in the active layer region 24, which is formed on an m plane, increasing the In composition does not cause a drop in luminous efficacy. As a result, a red light-emitting diode or a red laser diode is realized even with a light-emitting element that uses a nitride-based semiconductor by increasing the In composition much. In addition, the use of the active layer region 24 formed on an m plane enables the light-emitting element to emit light that is polarized in a direction parallel to the a axis.

In order for the light-emitting element to emit blue-range light whose wavelength λ1 is 420 nm or more and 470 nm or less, the In composition x is set to, for example, a value that satisfies 0.14≤x≤0.22. Similarly, in order for the light-emitting element to emit green-range light whose wavelength λ2 is 520 nm or more and 560 nm or less, the In composition x is set to, for example, a value that satisfies 0.29≤x≤0.34. In order for the light-emitting element to emit red-range light whose wavelength λ3 is 590 nm or more and 660 nm or less, the In composition x is set to, for example, a value that satisfies 0.38≤x≤0.45. More specifically, for example, x is set to 0.18 to 0.2 in order to emit blue light having a wavelength of 450 nm, to 0.29 to 0.31 in order to emit green light having a wavelength of 520 nm, and to 0.43 to 0.44 in order to emit red light having a wavelength of 630 nm. The In composition that corresponds to the light emission wavelength may slightly deviate from the ranges given above because the light emission wavelength is dependent on the thickness of the well layer, the amount of distortion, the manufacturing method, and the like. In the nitride-based semiconductor light-emitting element 100 of this embodiment, light having any of those wavelengths is polarized in a direction parallel to the a axis.

The nitride-based semiconductor light-emitting element 100 further includes a first conductivity-type electrode 40 and a second conductivity-type electrode 30, which are connected at a low resistance to the first conductivity-type semiconductor layer 22 and the second conductivity-type semiconductor layer 26, respectively. In this embodiment, a concave portion 42 is provided in the semiconductor multilayer structure 20 to expose a part of the first conductivity-type semiconductor layer 22 and the first conductivity-type electrode 40 is provided on the exposed part of the first conductivity-type semiconductor layer 22. The first conductivity-type electrode 40 has, for example, a multilayer structure of a Ti layer and a Pt layer (a Ti/Pt structure), and is connected to the first conductivity-type semiconductor layer 22 through ohmic contact. The first conductivity-type electrode 40 thus functions as an n-type ohmic electrode.

The second conductivity-type electrode 30 is provided on the second conductivity-type semiconductor layer 26. The second conductivity-type electrode 30 may be connected to the second conductivity-type semiconductor layer through ohmic contact. The second conductivity-type electrode 30 may cover a substantially entire surface of the second conductivity-type semiconductor layer 26. The second conductivity-type electrode 30 thus functions as a p-type ohmic electrode. A material of the second conductivity-type electrode 30 may be Mg or a Mg alloy.

In the thus structured nitride-based semiconductor light-emitting element 100, when a voltage is applied between the first conductivity-type electrode 40 and the second conductivity-type electrode 30, holes are injected from the second conductivity-type electrode 30 toward the active layer region 24 and electrons are injected from the first conductivity-type electrode 40 toward the active layer region 24. The holes and the electrons are recombined in the active layer region 24 and, at that point, the active layer region 24 emits light that has a wavelength determined by the gap band size, which in turn is determined by the semiconductor composition of the active layer region 24, and that is polarized in a direction parallel to the a axis.

In order to emit light of excellent optical polarization characteristics and to have high mechanical strength as well, the nitride-based semiconductor light-emitting element 100 uses the semiconductor chip 45 that has a thickness suited to the wavelength of the light to be emitted. In other words, when the band gap of the semiconductor constituting the active layer region 24 increases and the light emission wavelength is lengthened in the nitride-based semiconductor light-emitting element 100, the semiconductor chip 45 becomes accordingly thicker.

Specifically, in the case where the nitride-based semiconductor light-emitting element 100 emits blue-range light (when λ1 equals 420 nm to 470 nm), a thickness d1 of the semiconductor chip 45 is 110 μm or more and 150 μm or less (130±20 μm). Similarly, in the case where the nitride-based semiconductor light-emitting element 100 emits green-range light (when λ2 equals 520 nm to 560 nm), a thickness d2 of the semiconductor chip 45 is 200 μm or more and 240 μm or less (220±20 μm). In the case where the nitride-based semiconductor light-emitting element 100 emits red-range light (when λ3 equals 590 nm to 660 nm), a thickness d3 of the semiconductor chip 45 may be 250 μm or more and 290 μm or less (270±20 μm). The thickness of the semiconductor chip 45 is, even when the light-emitting element emits light of the shortest wavelength, 110 μm or more, which is greater than the chip thickness in common c-plane nitride-based semiconductor light-emitting elements.

The thickness of the semiconductor chip 45 (d1, d2, or d3) refers to the thickness of the entire semiconductor chip 45 including the first conductivity-type electrode 40 and the second conductivity-type electrode 30 in a direction in which the layers of the nitride-based semiconductor multilayer structure 20 are stacked. However, the first conductivity-type electrode 40 and the second conductivity-type electrode 30 are each approximately several μm in thickness and the thickness of the nitride-based semiconductor multilayer structure 20, too, is several μm or less. Most of the thickness of the semiconductor chip 45 is therefore taken up by the substrate 10.

Figure 4:
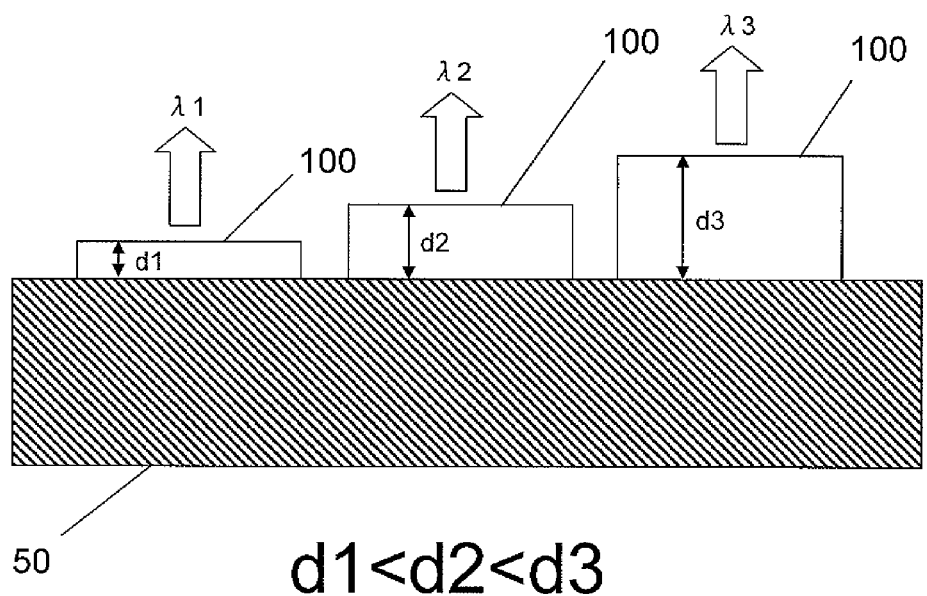
FIG. 4 is schematic sectional view of an illuminating device according to an embodiment of the present disclosure.

FIG. 4 is a schematic sectional view illustrating an illuminating device according to an embodiment of the present disclosure which uses a nitride-based semiconductor light-emitting element. As illustrated in FIG. 4, an illuminating device 111 includes a support substrate 50 and three nitride-based semiconductor light-emitting elements 100, which are supported onto the support substrate. The nitride-based semiconductor light-emitting elements 100 have the structure described above and are arranged, for example, such that the second conductivity-type electrode 30 is on the side of the support substrate 50. The first conductivity-type electrode 40 and the second conductivity-type electrode 30 are bonded and fixed to a pad electrode or the like (not shown) by, for example, flip-chip bonding. The directions of the three nitride-based semiconductor light-emitting elements 100 are adjusted such that the optical polarization directions of light beams to be emitted from the three nitride-based semiconductor light-emitting elements 100 match one another. For instance, arranging the three nitride-based semiconductor light-emitting elements 100 in a manner that puts their side faces parallel to one another makes the optical polarization directions of light beams emitted respectively from the three nitride-based semiconductor light-emitting elements 100 coincide with one another.

The three nitride-based semiconductor light-emitting element 100 each include, for instance, the active layer region 24 whose In composition ratio is determined, as described above, such that the nitride-based semiconductor light-emitting element 100 emits one of blue-range light (λ1), green-range light (λ2), and red-range light (λ3). The thicknesses of the semiconductor chips 45 are d1, d2, and d3, respectively, in the three nitride-based semiconductor light-emitting elements 100. Relations of λ1<λ2<λ3 and d1<d2<d3 are therefore satisfied. The differences in light emission wavelength thus create differences among the thicknesses d1, d2, and d3 of the semiconductor chip 45, and the illuminating device has a feature that the semiconductor chip 45 becomes thicker as the light emission wavelength lengthens.

Although the illuminating device 111 has three nitride-based semiconductor light-emitting elements 100, it is sufficient if at least two nitride-based semiconductor light-emitting elements 100 are provided. In this case, for example, two nitride-based semiconductor light-emitting elements 100 each include the active layer region 24 whose In composition ratio is determined such that the nitride-based semiconductor light-emitting element 100 emits one of blue-range light (λ1) and green-range light (λ2). The thicknesses of the semiconductor chips 45 are d1 and d2, respectively, in the two nitride-based semiconductor light-emitting elements 100. Relations λ1<λ2 and d1<d2 are therefore satisfied.

The illuminating device 111 is capable of emitting white light that is polarized in one direction (a direction parallel to the a axis) by simultaneously emitting light from the three nitride-based semiconductor light-emitting elements 100, and is capable of emitting visible light of any color that is polarized in one direction (a direction parallel to the a axis) by adjusting the light emission intensity of the three nitride-based semiconductor light-emitting elements 100.

A detailed description is given below on the optical polarization characteristics and the mechanical strength of the semiconductor chip 45 in relation to the thickness of the semiconductor chip 45 in the nitride-based semiconductor light-emitting element 100 and the illuminating device 111.

Figure 5:
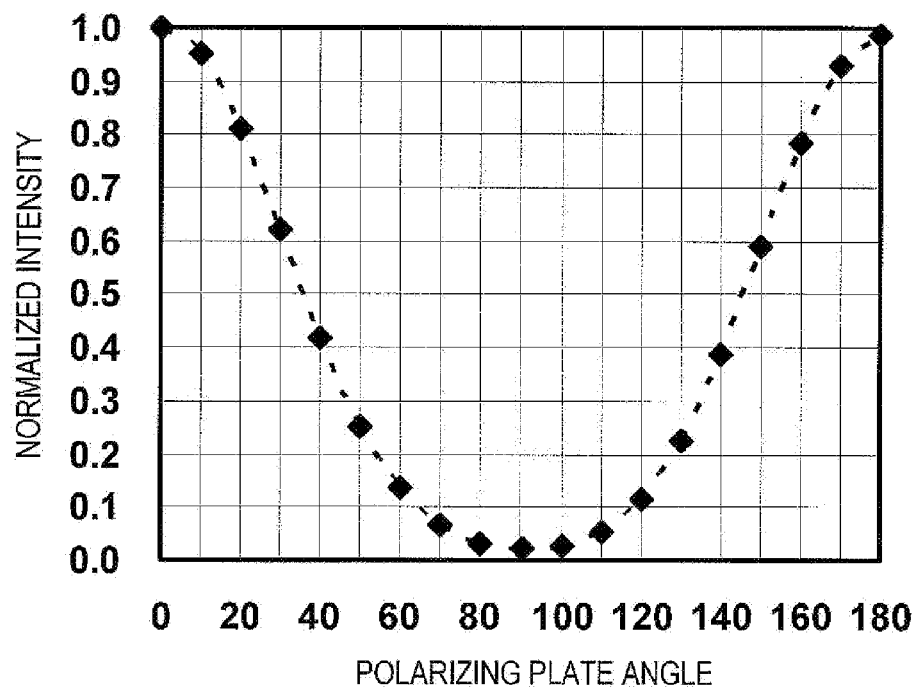
FIG. 5 is a graph illustrating the optical polarization characteristics of the nitride-based semiconductor light-emitting element according to one embodiment of the present disclosure.
Figure 6:
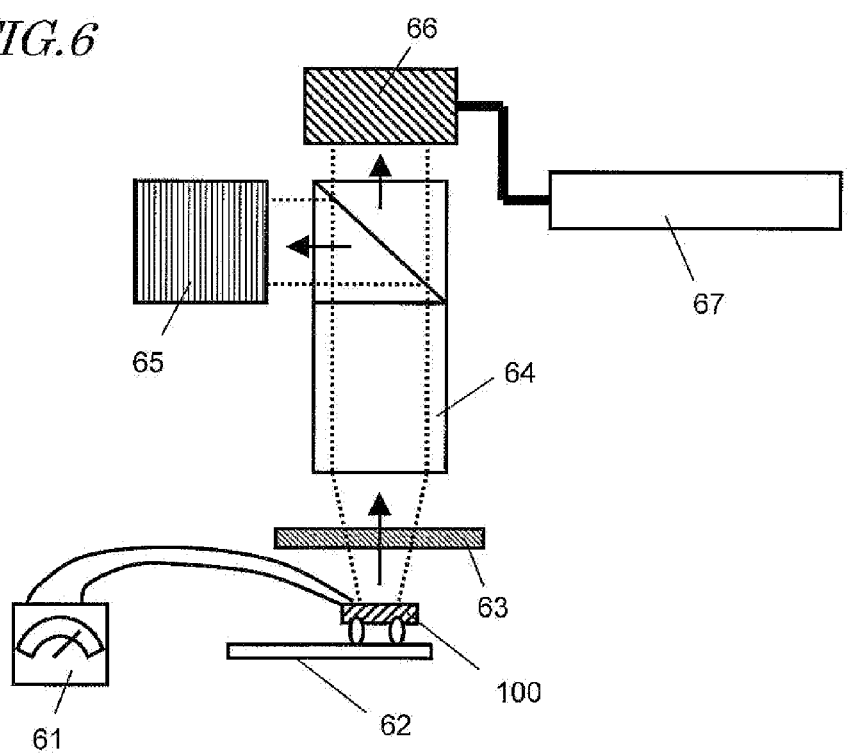
FIG. 6 is a configuration diagram of a measurement system that was used in the measurement of the optical polarization characteristics of FIG. 5.

FIG. 5 illustrates the result of measuring the optical polarization characteristics of the nitride-based semiconductor light-emitting element 100. FIG. 6 schematically illustrates a structure that was used for the measurement. The nitride-based semiconductor light-emitting element 100 is mounted to a packaging substrate 62 by flip-chip packaging, and light is emitted by causing a current to flow into the nitride-based semiconductor light-emitting element 100 from a power source 61. Light emitted from the nitride-based semiconductor light-emitting element 100 passes through a polarizing plate 63, and is led by an objective lens 64 to a camera 65 and to a detection portion 66 of a silicon detector 67, where the intensity of the light is detected. If the light emitted from the nitride-based semiconductor light-emitting element 100 has optical polarization characteristics, a change in light intensity is observed when the polarizing plate 63 is rotated.

FIG. 5 illustrates the relation between the intensity of light that is detected by the silicon detector 67 and the rotation angle of the polarizing plate 63. The graph illustrates different angles of the polarizing plate 63, with 0 degrees being an angle at which the polarizing plate 63 transmits light that is polarized in a direction parallel to the a axis of the active layer region 24 formed on an m plane. As illustrated in FIG. 5, the detected intensity of light decreased as the polarizing plate 63 rotated further and reached the minimum value when the angle was 90 degrees, in other words, when the polarizing plate 63 was arranged so as to transmit light that was polarized in a direction parallel to the c axis. It was confirmed from this that light emitted from the nitride-based semiconductor light-emitting element 100 was polarized in the a-axis direction. In contrast, light emitted from a c-plane nitride-based semiconductor light-emitting element does not exhibit such optical polarization characteristics and is in a random optical polarization (unpolarized) state.

FIGS. 7(*a*) and 7(*b*) show photographic images of the nitride-based semiconductor light-emitting element 100 which were taken with the camera 65 when the angle of the polarizing plate 63 was set to 0 degrees and 90 degrees, respectively. The operating current of the nitride-based semiconductor light-emitting element 100 was 10 mA and the shutter speed of the camera 65 was ¹⁄₁₀ seconds. It can be seen in the photographs that, when the angle of the polarizing plate 63 is 90 degrees, light emission is hardly observed and that the optical polarization direction of the polarizing plate 63 and the optical polarization direction of light emitted from the nitride-based semiconductor light-emitting element 100 are orthogonal to each other. The optical polarization ratio in this case is substantially 1.

Figure 8:
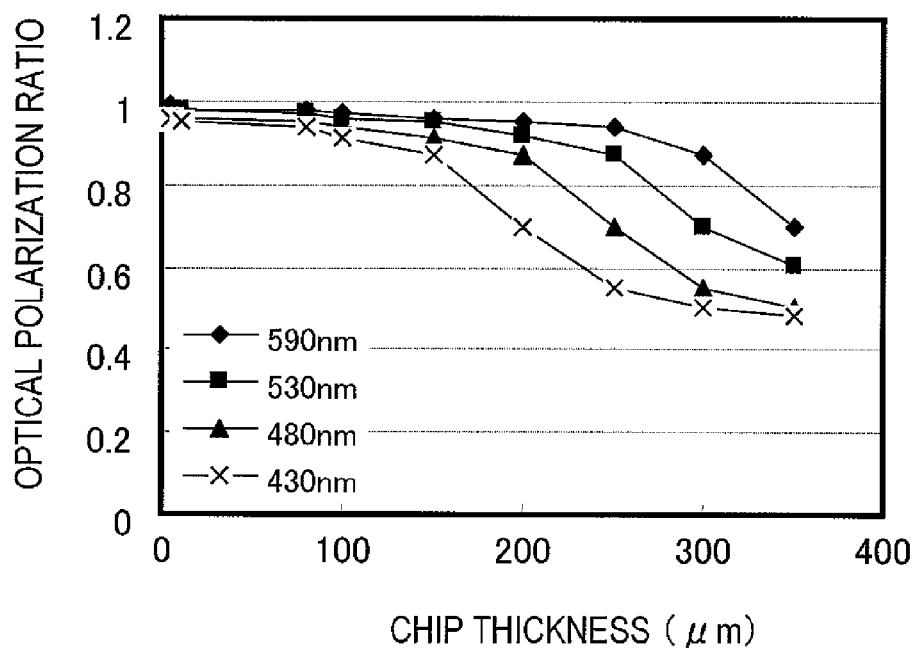
FIG. 8 is a graph illustrating for each light emission wavelength the chip thickness dependency of an optical polarization ratio, which is the ratio of light intensity detected by a silicon detector when the angle of the polarizing plate is 0 degrees and light intensity detected when the angle of the polarizing plate is 90 degrees.

FIG. 8 is a graph illustrating the wavelength dependency of the optical polarization ratio and the semiconductor chip thickness dependency of the optical polarization ratio. Using the configuration of FIG. 6, a light intensity A detected by the silicon detector 67 with the angle of the polarizing plate 63 set to 0 degrees and a light intensity B detected with the angle of the polarizing plate set to 90 degrees were measured to obtain (A−B)/A as the optical polarization ratio. The optical polarization ratio is 1 if the polarizing plate 63 set to an angle of 90 degrees does not transmit light, and the optical polarization ratio becomes smaller as the amount of light that is transmitted through the polarizing plate set to 90 degrees increases. The light emission wavelengths here are 430 nm, 480 nm, 530 nm, and 590 nm. The thicknesses of the semiconductor chips 45 here are 5 μm, 10 μm, 80 μm, 100 μm, 150 μm, 200 μm, 250 μm, 300 μm, and 350 μm. After determining for each of those wavelengths the semiconductor composition of the active layer region 24 that makes the active layer region 24 emit light having that wavelength, nitride-based semiconductor light-emitting elements are built to have the same structure as that of the nitride-based semiconductor light-emitting element 100 of FIG. 3. In order to vary the thickness of the semiconductor chip 45 from one element to another, samples having different semiconductor chip thicknesses were prepared by polishing the substrate 10, and the optical polarization ratio was measured with the use of the configuration of FIG. 6. Dry etching was used in combination in the production of the samples of the semiconductor chip 45 that respectively had thicknesses of 5 μm and 10 μm.

It can be seen in FIG. 8 that, at any of the wavelengths, the optical polarization ratio decreases as the thickness of the semiconductor chip 45 increases. However, when the light emission wavelength is longer, the thickness at which the optical polarization ratio starts to decrease is larger.

According to APPLIED PHYSICS LETTERS 92 (2008) 091105, in InGaN-based semiconductors, the valence band on the topmost level is constituted of a combination of two atomic orbitals, thereby making it possible to emit polarized light that is parallel to the a axis and polarized light that is parallel to the c axis. However, APPLIED PHYSICS LETTERS (2008) 091105 reports that, in InGaN-based semiconductors that are formed on an m plane, the transition that mainly occurs is one that leads to the emission of polarized light parallel to the a axis, due to the influence of compression stress. The result of FIG. 8 can be interpreted as indicating that an increase in the thickness of the semiconductor chip 45 changes the influence of stress applied to the active layer region 24 and consequently increases the occurrence of a transition that leads to the emission of polarized light parallel to the c axis.

That the optical polarization ratio varies in this manner depending on the semiconductor chip thickness is a property unique to m-plane nitride semiconductor layers. In the case where an active layer region that is constituted of a c-plane nitride semiconductor layer is used, the intensity of polarized light is the same at every angle from 0° to 360° and the optical polarization ratio is therefore constantly 0.

Figure 9:
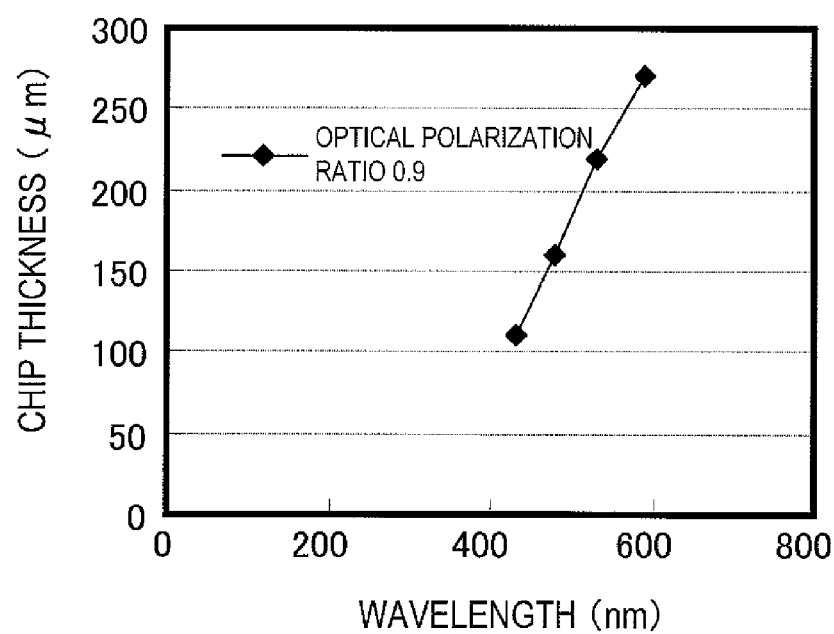
FIG. 9 is a graph illustrating the dependency of the chip thickness on the light emission wavelength that is observed when the optical polarization ratio drops to 0.9.

FIG. 9 illustrates the relation between the semiconductor chip thickness and the light emission wavelength that is observed when the optical polarization ratio drops to 0.9. When the wavelength is around 430 nm, the thickness of the semiconductor chip 45 that brings the optical polarization ratio down to 0.9 is slightly over 100 μm. The semiconductor chip thickness that can keep the optical polarization ratio to 0.9 increases as the light emission wavelength is lengthened, and is approximately 270 μm when the light emission wavelength is around 590 nm. The semiconductor chip thickness is approximately 160 μm when the light emission wavelength is around 480 nm, and approximately 220 μm when the light emission wavelength is around 530 nm.

Figure 10:
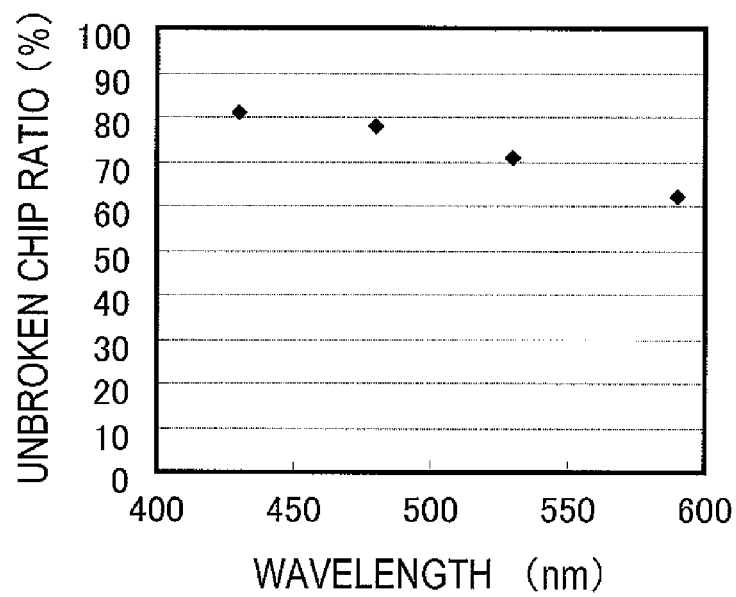
FIG. 10 is a graph illustrating for each light emission wavelength the proportion of unbroken chips that are counted after a chip for a nitrogen-based semiconductor light-emitting element is diced and flip-chip packaging is performed.

FIG. 10, on the other hand, is a graph illustrating the relation between the light emission wavelength and the mechanical strength of the semiconductor chip of the nitride-based semiconductor light-emitting element. After determining, for each of light emission wavelengths of 430 nm, 480 nm, 530 nm, and 590 nm, the semiconductor composition of the active layer region 24 that made the active layer region 24 emit light having that wavelength, nitride-based semiconductor light-emitting elements were built to have the same structure as that of the nitride-based semiconductor light-emitting element 100 of FIG. 3, except the thickness of the semiconductor chip 45. The semiconductor chip 45 in each sample was reduced in thickness to 90 μm by polishing the substrate 10, and then mounted by flip-chip packaging. The number of chips broken by the packaging was counted to obtain the proportion of unbroken chips for each of the light emission wavelengths.

As can be seen in FIG. 10, the proportion of unbroken chips is lower when the light emission length is longer. This is presumably because the mechanical strength of the chip, particularly the active layer region 24, declines as the In composition ratio in the semiconductor constituting the active layer region 24 becomes higher.

Figure 11:
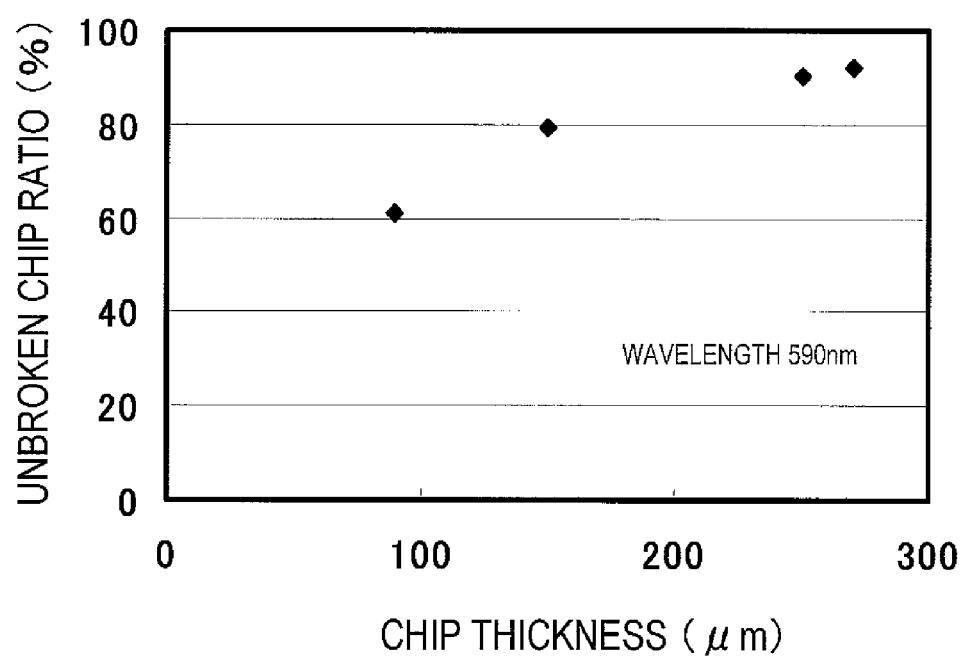
FIG. 11 is a graph illustrating for each chip thickness the proportion of unbroken chips that are counted after a chip for a nitrogen-based semiconductor light-emitting element having a wavelength of 590 nm is diced and flip-chip packaging is performed.

FIG. 11 is a graph illustrating the relation with the mechanical strength of the semiconductor chip of the nitride-based semiconductor light-emitting element. After determining the semiconductor composition of the active layer region 24 such that light to be emitted had a wavelength of 590 nm, nitride-based semiconductor light-emitting elements were built to have the same structure as that of the nitride-based semiconductor light-emitting element 100 of FIG. 3, except the thickness of the semiconductor chip 45. The semiconductor chip 45 in each sample was reduced in thickness to a value selected from 90 μm, 150 μm, 250 μm, and 270 μm by polishing the substrate 10, and then mounted by flip-chip packaging. The number of chips broken by the packaging was counted to obtain the proportion of unbroken chips for each of the light emission wavelengths.

As can be seen in FIG. 11, the proportion of unbroken chips is higher when the chip is thicker. It is therefore understood that the semiconductor chip 45 may be thick in order to improve the mechanical strength of the semiconductor chip 45.

The experiment results described above show that, in order to realize a light-emitting element of satisfactory mechanical strength while maintaining excellent optical polarization characteristics, the semiconductor chip 45 may be thick within a range that does not impair the optical polarization characteristics. Particularly in a nitride-based semiconductor light-emitting element that has a long light emission wavelength, the high In composition in the semiconductor makes its mechanical strength relatively weak but using a thick semiconductor chip 45 hardly lowers the optical polarization ratio. Thus, the mechanical strength is improved by making the semiconductor chip 45 thick and excellent optical polarization characteristics are maintained as well. Considering that m-plane nitride semiconductor layers are inferior to c-plane nitride semiconductor layers in terms of mechanical strength, accomplishing an improvement of the mechanical strength while maintaining the fine optical polarization characteristics in a nitride-based semiconductor light-emitting element is significant in realizing a silicon nitride-based semiconductor element fit for practical application.

It is also obvious from the results described above that, irrespective of whether $\lambda 1$, $\lambda 2$, and $\lambda 3$ are the wavelengths of blue light, green light, and red light, or other wavelengths, when the wavelength of emitted light is longer, the mechanical strength of the semiconductor chip is improved while maintaining the fine optical polarization characteristics by making the semiconductor chip thicker.

Light is regarded as polarized enough for practical use when the optical polarization ratio is 0.9 or higher. Therefore, as illustrated in FIG. 8, the thickness of the semiconductor chip 45 may be about 110 μm when the light emission wavelength is approximately 430 nm. When the light emission wavelength is approximately 590 nm, the thickness of the semiconductor chip 45 may be about 270 μm.

As is understood from FIG. 11, in the nitride-based semiconductor light-emitting element 100 that emits light having a wavelength of 590 nm, the proportion of unbroken chips is made 90% or higher by setting the thickness of the semiconductor chip 45 to 270 μm. In contrast, a nitride-based semiconductor light-emitting element that emits light having a wavelength of 590 nm and has the thickness of the semiconductor chip 45 that is set to 90 μm breaks easily and its proportion of unbroken chips stays around 60%. It can be said that, according to the present disclosure, the yield is improved by 1.5 times compared to common c-plane nitride-based semiconductor light-emitting elements, where the semiconductor chip thickness is generally 100 μm or less as described above. FIG. 8 also proves that polarized light parallel to the a axis can be emitted at an optical polarization ratio of 0.9 or higher, despite setting the thickness of the semiconductor chip 45 to 270 μm.

Light of blue color, light of green color, and light of red color that are typically the three primary colors of a white light source have wavelengths of 450 nm, 530 nm, and 590 nm, respectively. In order to emit light having those wavelengths at a high optical polarization ratio and to secure the mechanical strength of the semiconductor chip 45 at the same time, the thicknesses of the semiconductor chip 45 for blue light, the semiconductor chip 45 for green light, and the semiconductor chip 45 for red light are set to 130 μm, 220 μm, and 270 μm, respectively. However, the mechanical strength of the semiconductor chip 45 varies depending on crystal growth conditions, the type and thickness of a protective film formed, and other factors. Accordingly, a satisfactory strength is obtained in some cases even when the thickness of the semiconductor chip 45 is slightly smaller than the value given above. In other cases, the thickness of the semiconductor chip 45 may be set slightly larger than the value given above. When optimizing the chip thickness by polishing or the like, machining precision should be taken into account because the angle of the polished surface may be shifted and the thickness may fluctuate throughout the surface. Accordingly, the same effects are obtained when the thickness of the semiconductor chip 45 is within ±20 μm of each of the values given above in each of the nitride-based semiconductor light-emitting element that emits blue light, the nitride-based semiconductor light-emitting element that emits green light, and the nitride-based semiconductor light-emitting element that emits red light.

As described above, according to the nitride-based semiconductor light-emitting element 100 of this embodiment where the semiconductor chip thickness is set to a given thickness depending on the light emission wavelength, light having excellent optical polarization characteristics is emitted and the mechanical strength of the semiconductor chip is improved as well.

According to the illuminating device 111 of this embodiment which includes two or more nitride-based semiconductor light-emitting elements 100, relations of $\lambda 1<\lambda 2$ and $d1<d2$ are satisfied when the light emission wavelengths of two nitride-based semiconductor light-emitting elements 100 are given as $\lambda 1$ and $\lambda 2$, and the thicknesses of the elements' semiconductor chips are given as d1 and d2. The illuminating device 111 is therefore capable of emitting light of excellent optical polarization characteristics and improved in mechanical strength of each semiconductor chip.

In addition, with the mechanical strength of the semiconductor chip secured, it is possible to accomplish the hitherto difficult goal of obtaining a light-emitting element that emits polarized long-wavelength light, such as orange light or red light.

A method of manufacturing the nitride-based semiconductor light-emitting element 100 and the illuminating device 111 is described next with reference to FIGS. 3 and 4.

First, the substrate 10 that has an m plane as the principal surface is prepared as illustrated in FIG. 3. This embodiment uses a GaN substrate as the substrate 10. The GaN substrate in this embodiment is manufactured by, for example, hydride vapor phase epitaxy (HVPE).

For instance, a thick GaN film on the order of several mm is formed first on a c-plane sapphire substrate. Thereafter, the thick GaN film is cut out by cutting in a direction perpendicular to the c plane and parallel to an m plane, to thereby obtain an m-plane GaN substrate. How the GaN substrate is manufactured is not limited to this method and, for example, a bulk GaN ingot may be produced by liquid phase growth such as sodium flux or by melt growth such as ammonothermal growth to cut a substrate that has an m plane out of the ingot.

Examples of other substrates than the GaN substrate that can be used as the substrate 10 include gallium oxide substrates, SiC substrates, Si substrates, and sapphire substrates. In order to form, on the substrate, through epitaxial growth, a GaN-based semiconductor that is constituted of an m plane, the plane orientation may be set to an m plane in SiC substrates and sapphire substrates, too. However, there are reports of the growth of a-plane GaN on an r-plane sapphire substrate, and it is not always necessary for the substrate 10 to have an m plane as a surface in order to grow a semiconductor layer that has an m plane as a principal surface. It is sufficient if at least the active layer region 24 is parallel to an m plane and crystals thereof grow in a direction perpendicular to the m plane.

In this embodiment, the semiconductor multilayer structure 20 is formed on the substrate 10 by metal organic chemical vapor deposition (MOCVD).

Specifically, the first conductivity-type semiconductor layer 22 is formed through epitaxial growth on the GaN substrate 10 having an m plane. For example, silicon is used as n-type impurities and $TMG(Ga(CH_3)_3)$ and $NH_3$ are supplied as raw materials to form the first conductivity-type semiconductor layer 22 from GaN at a growth temperature of 1,100° C. to a thickness of 3 μm.

Next, the active layer region 24 is formed on the first conductivity-type semiconductor layer 22. The active layer region 24 has, for example, a GaInN/GaN multiple quantum well (MQW) structure with a thickness of 81 nm in which $Ga_{1-x}In_xN$ well layers each having a thickness of 9 nm and GaN barrier layers each having a thickness of 9 nm are stacked alternately. When forming the $Ga_{1-x}In_xN$ well layers, the growth temperature may be lowered to 800° C. in order to take in In. A light emission wavelength appropriate for the use of the nitride-based semiconductor light-emitting element 100 is selected and the In composition x suited to the wavelength is determined. To set the wavelength to 450 nm (blue), a value from 0.18 to 0.2 is determined as the In composition x. In the case of 520 nm (green), the In composition x is 0.29 to 0.31. In the case of 630 nm (red), the In composition x is 0.43 to 0.44. By controlling the In composition in this manner, the nitride-based semiconductor light-emitting elements 100 that separately emit blue light, green light, and red right are obtained to be used in the illuminating device 111.

An undoped GaN layer is formed next on the active layer region 24 by deposition to a thickness of, for example, 30 nm. The second conductivity-type semiconductor layer 26 is formed on the undoped GaN layer. For example, the second conductivity-type semiconductor layer 26 is formed from $p\text{-}Al_{0.14}Ga_{0.86}N$ to a thickness of 70 nm by using $Cp_2Mg$ (cyclopentadienyl magnesium) as p-type impurities, supplying TMG, TMA, and $NH_3$ as raw materials, and setting the growth temperature to 1,100° C.

Next, a p-GaN contact layer is formed on the second conductivity-type semiconductor layer 26 by deposition with $Cp_2Mg$ as a dopant to a thickness of, for example, 0.5 μm.

Thereafter, dry etching is performed with the use of chlorine-based gas to partially remove the p-GaN contact layer, the second conductivity-type semiconductor layer 26, the undoped GaN layer, the active layer region 24, and the first conductivity-type semiconductor layer 22. The concave portion 42 is formed as a result, exposing a part of the first conductivity-type semiconductor layer 22.

A Ti/Pt layer is formed next as the first conductivity-type electrode 40 on a part of the exposed portion of the first conductivity-type semiconductor layer 22 which is located at the bottom of the concave portion 42. On the p-GaN contact layer, a Mg/Pt layer is formed as the second conductivity-type electrode 30. Heat treatment is then performed to alloy the Ti/Pt layer with the first conductivity-type semiconductor layer 22 and to alloy the Mg/Pt layer with the p-GaN contact layer. Obtained as a result are the first conductivity-type electrode 40 and the second conductivity-type electrode 30 which are connected through ohmic contact to the first conductivity-type semiconductor layer 22 and to the p-GaN contact layer, respectively.

The substrate 10 is then partially removed by laser lift-off, etching, polishing, or other similar methods so that the semiconductor chip 45 has a given thickness that is determined by the light emission wavelength. As long as the thickness of the semiconductor chip 45 takes the given value, the substrate 10 may be removed entirely. Further, the first conductivity-type semiconductor layer 22 may be partially removed. Alternatively, the substrate 10 may not be removed. Through the steps described above, the nitride-based semiconductor light-emitting element 100 is completed.

To manufacture the illuminating device 111, three different nitride-based semiconductor light-emitting elements 100 having different wavelengths are mounted as illustrated in FIG. 4 by flip-chip packaging onto the support substrate 50, which is made from a ceramic substrate or the like. The three different nitride-based semiconductor light-emitting elements 100 may be arranged on the support substrate 50 such that the optical polarization directions of light beams emitted from the nitride-based semiconductor light-emitting elements 100 coincide with one another. Alternatively, the nitride-based semiconductor light-emitting elements 100 may be arranged on the support substrate 50 such that the optical polarization direction is varied from one nitride-based semiconductor light-emitting element 100 to another, depending on what color of light the nitride-based semiconductor light-emitting element 100 emits.

(Second Embodiment)

Figure 12:
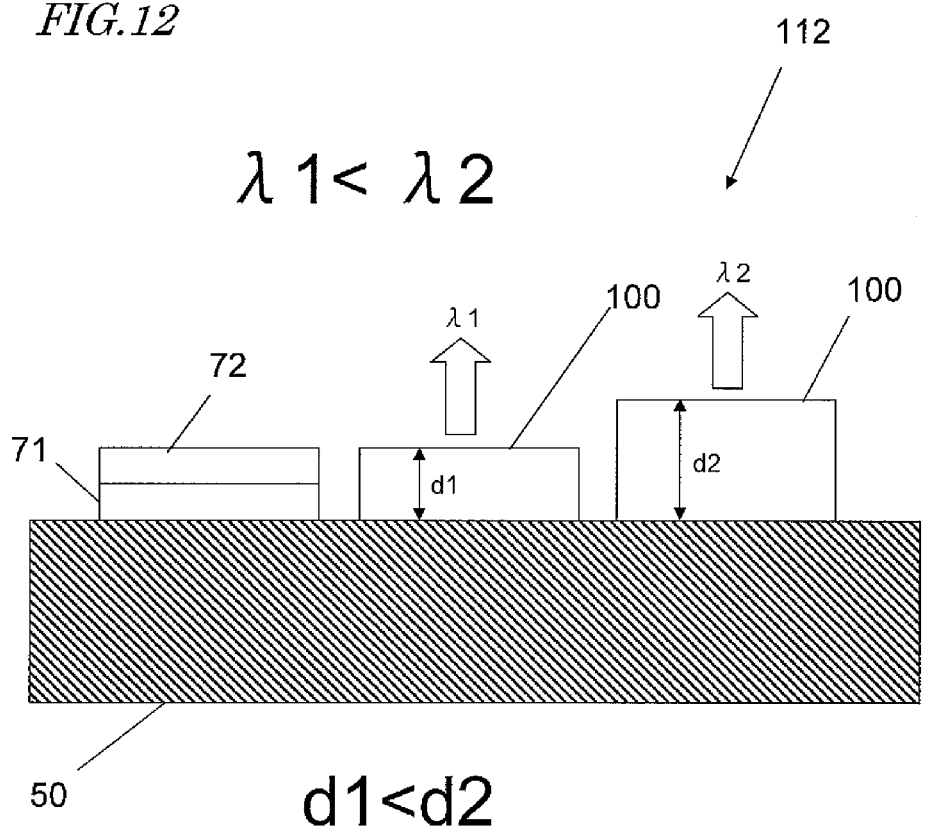
FIG. 12 is a schematic sectional view illustrating another mode of the illuminating device according to the present disclosure.

Another mode of the illuminating device according to the present disclosure is described below with reference to the drawings. FIG. 12 schematically illustrates the structure of an illuminating device 112. As illustrated in FIG. 12, the illuminating device 112 includes two nitride-based semiconductor light-emitting elements 100 of the first embodiment, an AlGaInP-based light-emitting element 71, and a polarizing filter 72. The two nitride-based semiconductor light-emitting elements 100 emit light having the blue-range wavelength λ1 and light having the green-range wavelength λ2, respectively. The semiconductor chips 45 of the two nitride-based semiconductor light-emitting elements 100 have thicknesses of d1 and d2, respectively. As described in the first embodiment, relations of λ1<λ2 and d1<d2 are satisfied.

The AlGaInP-based light-emitting element 71 emits light having a red-range wavelength. However, the AlGaInP-based light-emitting element 71 does not have optical polarization characteristics and therefore the polarizing filter 72 is disposed at a position where light emitted from the AlGaInP-based light-emitting element 71 is transmitted.

Desirably, the illuminating device 112 further includes the support substrate 50 to support the two nitride-based semiconductor light-emitting elements 100 and the AlGaInP-based light-emitting element 71 on the support substrate 50. More desirably, the nitride-based semiconductor light-emitting elements 100 and the AlGaInP-based light-emitting element 71 are supported on the substrate 50 in a manner that makes the optical polarization directions of the two nitride-based semiconductor light-emitting elements 100 coincide with the optical polarization direction of the polarizing filter 72.

In the active layer region 24 (FIG. 3) formed on an m plane, a piezo-electric field is not generated and increasing the In composition therefore does not lower the luminous efficacy. However, the nitride-based semiconductor light-emitting element 100 provided with the active layer region 24 that emits red-range light, i.e., light having a wavelength of approximately 650 nm is in some cases smaller in power than the nitride-based semiconductor light-emitting element 100 that emits blue-range light and the nitride-based semiconductor light-emitting element 100 that emits green-range light. In such a case, using the AlGaInP-based light-emitting element 71 which has high luminous efficacy makes the intensity of red light emitted from the AlGaInP-based light-emitting element 71 equivalent to that of blue light and green light emitted from the nitride-based semiconductor light-emitting elements 100. The illuminating device 112 which has optical polarization characteristics and emits white light by additive color mixing is realized in this manner.

Further, in each of the nitride-based semiconductor light-emitting element 100 that emits blue-range light and the nitride-based semiconductor light-emitting element 100 that emits green-range light, the semiconductor chip 45 is set to a given thickness that is determined depending on the light emission wavelength as described in the first embodiment. The illuminating device 112 can thus emit light having excellent optical polarization characteristics, and is improved in the mechanical strength of the semiconductor chips.

(Third Embodiment)

A liquid crystal display device according to an embodiment of the present disclosure is described below with reference to the drawings. A nitride-based semiconductor light-emitting element of the present disclosure emits polarized light. The polarized light is used favorably as a backlight of a liquid crystal display device. A mode of a liquid crystal display device that uses the nitride-based semiconductor light-emitting element of the present disclosure is described here. FIGS. 13(a) and 13(b) are respectively a conceptual perspective view and sectional view of a liquid crystal display device 113. The liquid crystal display device 113 includes an illuminating device 114 and a liquid crystal panel 501. The liquid crystal panel 501 is supported by a housing 512, and the liquid crystal display device 113 is placed inside the housing 512. The illuminating device 114 includes a plurality of illumination units 509 arranged in a matrix pattern in a housing 511, which has a flat rectangular shape.

In this embodiment, the liquid crystal panel 501 is supported by the housing 512, which is separate from the housing 511 of the illuminating device 114. This is because the liquid crystal panel 501 and the illuminating device 114 are manufactured separately and the liquid crystal panel 501 needs to be carried alone. In the case where the liquid crystal panel 501 and the illuminating device 114 are manufactured in the same place and finished as a liquid crystal display device, the liquid crystal panel and the illuminating device may be supported by one housing.

This embodiment describes a "downlight type" in which a backlight is disposed behind the liquid crystal panel 501 to irradiate the liquid crystal panel 501 substantially directly with light from the backlight. However, the present disclosure is not limited to this structure and is also applicable to an "edge light type" in which a backlight is attached to the frame portion of the liquid crystal panel 501 to irradiate the liquid crystal panel with light led to the liquid crystal panel by a light guide plate and a diffusion plate.

FIG. 14 is a schematic diagram illustrating the sectional structure of each of the illumination units 509. The illumination unit 509 includes a package 202 and three nitride-based semiconductor light-emitting elements 100. The package 202 has an opening and an inner space, and bumps 203 are formed on the bottom of the package 202 which functions as the support substrate 50. The bottom of the package 202 is formed from, for example, a material high in insulation properties and heat conductivity, in this embodiment, a ceramic substrate. The rest of the package 202 may be formed from a material that has insulation properties, is easy to form, and has high adhesion, and in this embodiment, formed from epoxy resin.

The three nitride-based semiconductor light-emitting elements 100 are housed in the inner space of the package 202, with the first conductivity-type electrodes 40 (not shown) and the second conductivity-type electrodes 30 (not shown) of the nitride-based semiconductor light-emitting elements 100 bonded to the bumps 203 by flip-chip bonding. The bumps 203 are formed from a material having high conductivity, and in this embodiment, formed from gold. The three nitride-based semiconductor light-emitting elements 100 constitute the illuminating device 111 described in the first embodiment in this manner. While each illumination unit in this embodiment is constituted of three nitride-based semiconductor light-emitting elements 100 in this embodiment, the illuminating device 112 described as the second embodiment may instead be used as an illumination unit.

For each of the three nitride-based semiconductor light-emitting elements 100, the semiconductor composition of the active layer region 24 is selected such that the nitride-based semiconductor light-emitting element 100 emits polarized light of one of blue color, green color, and red color as described in detail in the first embodiment. The three nitride-based semiconductor light-emitting elements 100 are also arranged such that the optical polarization directions of light beams to be emitted from the three nitride-based semiconductor light-emitting elements 100 coincide with one another. For instance, arranging the three nitride-based semiconductor light-emitting elements 100 in a manner that puts their side faces parallel to one another makes the optical polarization directions of light beams to be emitted from the three nitride-based semiconductor light-emitting elements 100 coincide with one another.

Wiring 204 made from a highly conductive material is provided on the rear face of the package 202 and passes through the bottom of the package 202 to be electrically connected to the bumps 203.

An optical lens 205 is provided at the opening of the package 202, and the exterior of the optical lens 205 is sealed with a sealing member 206. The optical lens 205 can be any lens that collimates divergent light beams, such as a convex lens, a Fresnel lens, or a hologram lens. A cylindrical Fresnel lens is used in this embodiment. The three nitride-based semiconductor light-emitting elements 100 may be each disposed such that the light emission face is positioned near a focal point of the optical lens 205 that is associated with the nitride-based semiconductor light-emitting element 100. This way, light beams emitted from the three nitride-based semiconductor light-emitting elements 100 are all turned accurately into parallel beams by the optical lens 205. Specifically, each nitride-based semiconductor light-emitting element 100 may be placed in a concave portion which is provided in a region of the support substrate 50 where the element is to be disposed and which is suited to the size of the element. The depth of each concave portion is set to a value suited to the thickness of the semiconductor chip 45 of the relevant element out of the three nitride-based semiconductor light-emitting elements 100. Silicone, fluororesin, epoxy resin, or the like can be used for the sealing member 206.

To give the illumination unit 509 practical outside dimensions, a face of the illumination unit 509 that is parallel to the optical lens 205 is a rectangle of approximately 0.3 mm to 2 mm×0.3 mm to 2 mm, and in this embodiment, 1 mm×1 mm. When the inner space of the package 202 of the illumination unit 509 has a height 208 that is five to six times larger than the furthest distance between two nitride-based semiconductor light-emitting elements 100 on the plane where the three nitride-based semiconductor light-emitting elements 100 are disposed, light beams emitted from the three nitride-based semiconductor light-emitting elements 100 are mixed well enough to produce white light.

Voltage application to the wiring 204 causes the three nitride-based semiconductor light-emitting elements 100 to simultaneously emit light beams, which are collimated by the optical lens 205 into parallel beams and emitted as white light. The white light is polarized in one direction as described in the first embodiment. The light emission intensity of the illumination unit 509 can be modulated by adjusting the power applied to the three nitride-based semiconductor light-emitting elements 100.

In the illumination unit 509, the chromaticity of light to be emitted may be modulated by providing a fluorescent substance between the nitride-based semiconductor light-emitting elements 100 and the optical lens 205, between the optical lens 205 and the sealing member 206, or outside the sealing member 206. The arrangement order of the optical lens 205 and the sealing member 206 may be changed, or other optical lenses and sealing members may be added. Alternatively, the sealing member 206 may be omitted by giving the function of the sealing member 206 to the optical lens 205.

The three nitride-based semiconductor light-emitting elements 100, which, in the illumination unit 509, are housed in a single package, may be housed in separate packages. For instance, an illumination unit 509' illustrated in FIG. 15(*a*) may be used in the illuminating device 114. The illumination unit 509' includes light emitting units 510B, 510G, and 510R in which nitride-based semiconductor light-emitting elements 301, 302, and 303 are packaged respectively, half mirrors 212, and an optical lens 211. The nitride-based semiconductor light-emitting elements 301, 302, and 303 emit polarized blue light, polarized green light, and polarized red light, respectively.

FIG. 15(*b*) schematically illustrates the sectional structure of the light-emitting unit 510B. The light-emitting unit 510B includes the package 202. As in the illumination unit 509, the package 202 has an opening and an inner space, and the bumps 203 are formed on the bottom face of the package 202 which functions as the support substrate 50. The nitride-based semiconductor light-emitting element 301 is housed in the inner space of the package 202, with the first conductivity-type electrode 40 (not shown) and the second conductivity-type electrode 30 (not shown) of the nitride-based semiconductor light-emitting element 301 bonded to the bumps 203 by flip-chip bonding. The wiring 204 is provided on the rear face of the package 202 and passes through the bottom of the package 202 to be electrically connected to the bumps 203. The optical lens 205 is provided at the opening of the package 202, and the exterior of the optical lens 205 is sealed with the sealing member 206. The light-emitting units 510G and 510R, too, have the same structure.

As illustrated in FIG. 15(*a*), blue beams emitted from the light-emitting unit 510B which are parallel beams and polarized are transmitted through the two half mirrors 212 and then enter the optical lens 211. Green beams and red beams emitted from the light-emitting unit 510G and the light-emitting unit 510R, respectively, which are parallel beams and polarized are reflected by the half mirrors 212 and then enter the optical lens 211. In this manner, the optical lens 211 collects and mixes blue light, green light, and red light, to thereby emit polarized white beams that are parallel beams. If necessary, an optical lens 205 may be provided to ensure that emitted white beams are parallel beams. The light-emitting units 510B, 510G, and 510R are arranged such that the optical polarization directions of light beams emitted from the light-emitting units 510B, 510G, and 510R coincide with one another.

The liquid crystal display device 113 in this embodiment is thirty-two inches in size. In the illuminating device 114, the illumination units 509 are arranged in eight columns by five rows. The illumination units 509 are disposed in a manner that gives all of the 5×8 illumination units 509 the same optical polarization direction.

As illustrated in FIGS. 13(*a*) and 13(*b*), the illuminating device 114 includes an optical sheet 507 and an optical plate 508, which are disposed so as to transmit light that is emitted from the plurality of illumination units 509 arranged in a matrix pattern.

The optical plate 508 includes a light incident face 508*a* and a light exit face 508*b*. The optical plate 508 guides light that has been emitted from the illumination units 509 to the light exit face 508*b* through the light incident face 508*a* while maintaining the light's optical polarization, and causes the light to exit toward the liquid crystal panel 501 via the optical sheet 507. The illumination units 509 emit p-polarized light beams as parallel beams. The liquid crystal panel 501 includes a pair of polarizing plates 502 and 503, and a liquid crystal substrate 505 sandwiched between the polarizing plates 502 and 503. The polarizing plate 503 is designed to transmit only p-polarized light. The optical polarization direction of light emitted from the illuminating device 114 coincides with the optical polarization direction of the polarizing plate 503. The polarizing plate 503 can thus very efficiently transmit light emitted from the illumination units 509 of the illuminating device 114. The optical polarization direction of the light transmitted through the polarizing plate 503 is rotated in the liquid crystal substrate 505, for each display pixel, based on image data, in a manner that suits the liquid crystal alignment. The light then exits from a pixel that has the same optical polarization direction as that of the polarizing plate 502.

The optical plate 508 has a thickness of approximately 1 to 3 mm, and is made of methacrylate styrene (MS) which is acrylic resin, or such resin as polycarbonate (PC) or cycloolefin polymer. The optical plate 508 may be doped with a small amount of diffuser such as silica.

Instead of doping with a diffuser, an optical plate 701 in which concavity and convexity are provided on one side as illustrated in FIG. 16(a) or an optical plate 702 in which concavity and convexity are provided on both sides as illustrated in FIG. 16(b) may be used. The reason why this light diffusion is performed is to enhance the illumination uniformity ratio of light emitted from the illuminating device 114. This diffusion means is therefore unnecessary when light emitted from the illumination units 509 is not varied in amount in places and is emitted uniformly. In this embodiment, a 2 mm-thick acrylic plate in which a small amount of silica is mixed is used as the optical plate 508.

The optical sheet 507 has a thickness of several tens μm to several hundreds μm and, similarly to the optical plate 508, is made of acrylic resin or other types of resin in which a small amount of diffuser such as silica is mixed. In this embodiment, a diffusion sheet having a thickness of 150 μm and doped with a small amount of silica is used. Light transmitted through the optical plate 508 is slightly diffused with the use of silica, to thereby adjust the improvement in illumination uniformity ratio.

Because the optical plate 508 and the optical sheet 507 are thus used to enhance the illumination uniformity ratio, at least one of the optical plate 508 and the optical sheet 507 may be omitted when light that is emitted from the illumination units 509 arranged in a matrix pattern has an illumination uniformity ratio equal to or higher than a reference value. On the other hand, when light that is emitted from the illumination units 509 arranged in a matrix pattern does not have a high illumination uniformity ratio, a plurality of optical sheets 507 may be used.

The optical plate 508 and the optical sheet 507 also play the role of changing the optical polarization of light that has been reflected by the polarizing plate 503 of the liquid crystal panel 501 and thereby reflecting the light back. The presence of silica mixed in and the concavity and convexity provided on the top face, or on the top face and bottom face each, improve the effect of changing the optical polarization of light and reflecting the light back.

The liquid crystal display device of this embodiment does not need to put in optical parts for controlling optical polarization between the optical plate 508 and the optical sheet 507 in the illuminating device 114, and thus has a feature that an illuminating device small in the number of parts and high in front luminance and luminous efficiency is realized with only the simple optical plate 508 and optical sheet 507. Moreover, the liquid crystal display device does not need to use the polarizing plate 503 when the degree of optical polarization of light emitted from the illumination units 509 is so high that there is no chance of affecting the image quality of displayed images. This further reduces the number of parts and helps to cut manufacturing cost.

Figure 17:
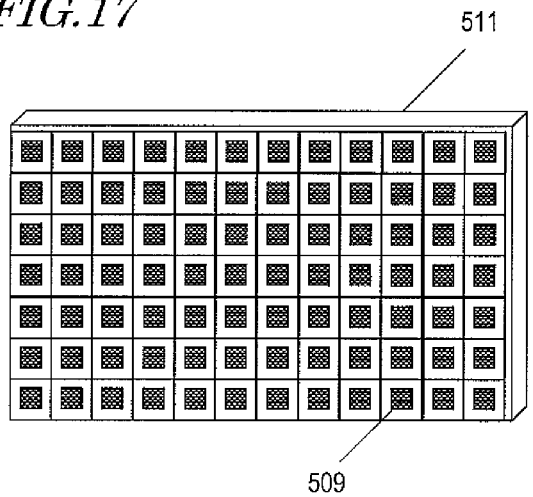
FIG. 17 is a diagram illustrating an arrangement of the illumination units in the illuminating device of the liquid crystal display device of FIG. 13.

In order to improve the illumination uniformity ratio, it is important to raise the proportion of the light-emitting regions of the nitride-based semiconductor light-emitting elements to the exit face of the illumination device. To this end, the interval between one illumination unit 509 and another illumination unit 509 is set as short as possible. For example, by structuring the illumination unit 509 of FIG. 14 in a manner that prevents the wiring 204 provided on the rear face of the package 202 from sticking out of the package 202, the plurality of illumination units 509 can be arranged in a matrix pattern inside the housing 511 with no space between one unit and another as illustrated in FIG. 17, and the illumination uniformity ratio is accordingly enhanced. In this case, an illuminating device that is high in illumination uniformity ratio is realized without using the optical plate 508 and the optical sheet 507.

Figure 18:
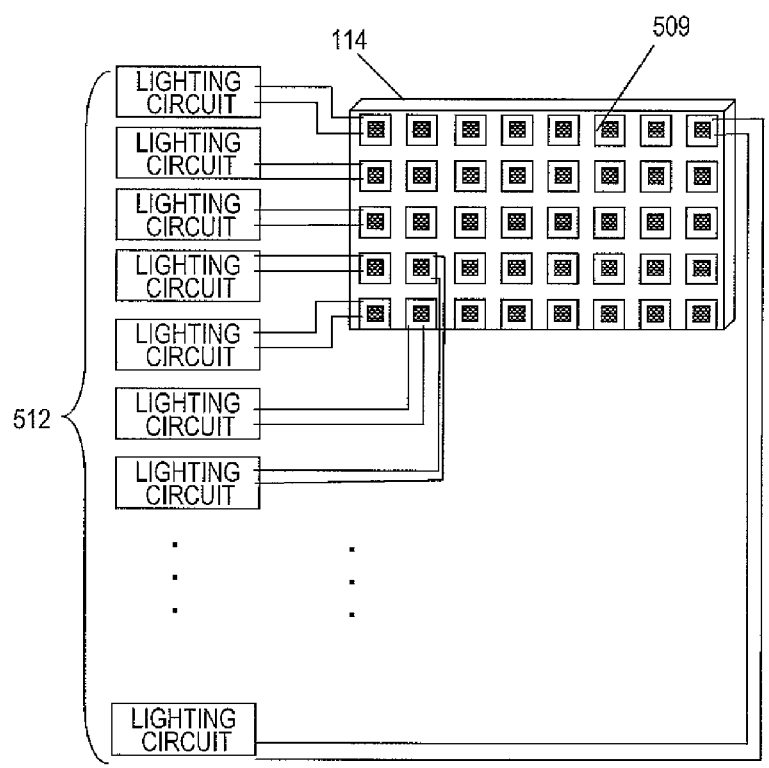
FIG. 18 is a diagram illustrating an example of a drive circuit of the illumination unit in the illuminating device of the liquid crystal display device of FIG. 13.

FIG. 18 illustrates an example of a drive circuit of the illuminating device 114 with the illumination units 509 arranged in eight columns by five rows in which lighting circuits are disposed to control the illumination units 509 independently of one another.

Controlling the amount of light of each illumination unit 509 separately in this manner enhances the contrast of an image displayed on the liquid crystal panel 501, and saves energy as well.

The illumination units 509 in the embodiment described above are arranged in a matrix pattern. In the case where the intensity of light emitted from the illumination units 509 is high, however, a display device that functions as a backlight with fewer illumination units 509 may be made.

Figure 19:
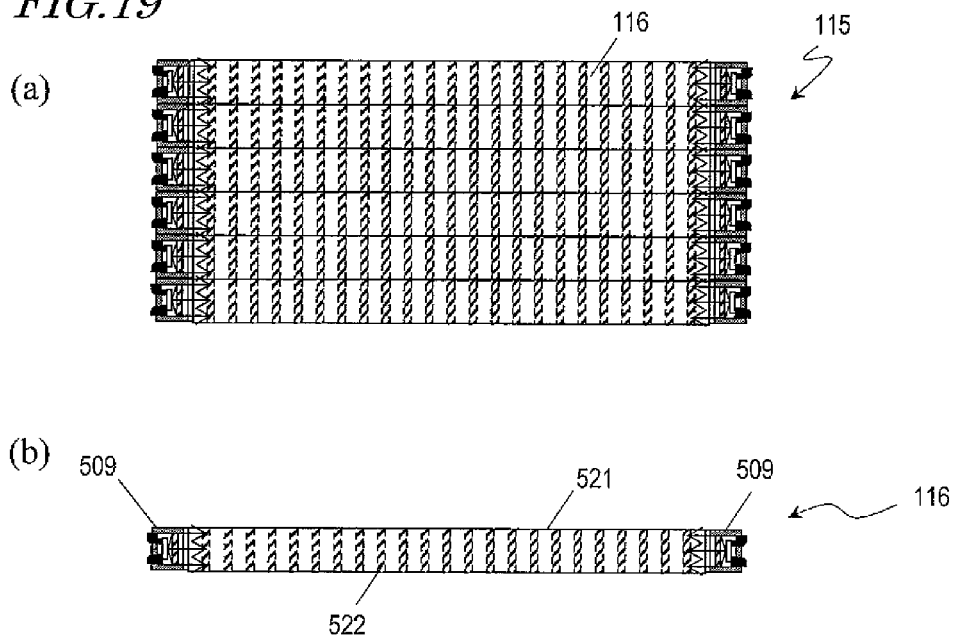
FIGS. 19(*a*) and 19(*b*) are diagrams illustrating another example of the illuminating device of the liquid crystal display device of FIG. 13.

FIG. 19(a) schematically illustrates the structure of another illuminating device 115 that is to be used in the liquid crystal display device of this embodiment. The illuminating device 115 includes a plurality of illumination portions 116. FIG. 19(b) schematically illustrates the structure of each of the illumination portions 116. The illumination portion 116 includes a light guide plate 521 and a pair of illumination units 509.

The light guide plate 521 has, for example, a length approximately the same as the lateral length of the liquid crystal panel 501. One illumination unit 509 is disposed at each end of the light guide plate 521, and light beams emitted from the illumination units 509 are transmitted through the interior of the light guide plate 521. The light guide plate 521 has a thickness of approximately 1 to 3 mm, and is made of methacrylate styrene (MS) which is acrylic resin, or such resin as polycarbonate (PC) or Zeonor. In this embodiment, an acrylic plate that is 2 mm in thickness is used. A plurality of light path altering elements 522 are provided at given intervals in the light guide plate 521. The light path altering elements 522 vertically reflect a part of light transmitted through the interior of the light guide plate 521 and cause the light to exit from a surface of the light guide plate 521. The light path altering elements 522 are constituted of hologram mirrors, half mirrors, or the like. Hologram mirrors are used in this embodiment. With this structure, polarized light is emitted from the principal surface of the light guide plate 521 while maintaining the optical polarization of light emitted from the illumination units 509.

The illuminating device 115 has the plurality of illumination portions 116 in the longitudinal direction of the liquid crystal panel 501. The number of the illumination portions 116 and the number of the light path altering elements 522 disposed in the light guide plate 521 are determined based on the intensity of light emitted from the illumination units 509, the intensity of light requested of the illuminating device 115, and the illumination uniformity ratio of emitted light. In this embodiment, five illumination portions 116 are aligned in a direction perpendicular to the longitudinal direction of the illumination portions 116. Light beams polarized in the same direction are thus emitted from the principal surfaces of the five illumination portions 116. The optical plate 508 and the optical sheet 507 may be used in order to improve the illumination uniformity ratio and to reflect again light that has been reflected by the liquid crystal panel.

With the illuminating device 115, too, a lens sheet and a brightness enhancement film which have been necessities in conventional technologies can be omitted, and therefore a low power consumption liquid crystal display device is realized which is reduced in manufacturing cost and high in light utilization ratio.

The illumination units 509 and 509' and the light-emitting units 510B, 510G, and 510R which are used in the illuminating device 114 of this embodiment may be used as the illumination of other devices than liquid crystal display devices. As described in the first embodiment, the illumination units 509 and 509' and the light-emitting units 510B, 510G, and 510R are applicable to various uses as an illuminating device capable of emitting visible light of any wavelength which is polarized in one direction by adjusting power applied to nitride-based semiconductor light-emitting elements that respectively emit blue light, green light, and red light.

In the nitride-based semiconductor light-emitting elements or illuminating devices of the first to third embodiments, a fluorescent substance for wavelength conversion may be provided. This way, a light source that can emit light of an expanded wavelength band is realized.

(Fourth Embodiment)

A nitride-based semiconductor light-emitting element, illuminating device, and liquid crystal display device according to still another embodiment of the present disclosure are described below. The nitride-based semiconductor light-emitting element, illuminating device, and liquid crystal display device of this embodiment differ from the nitride-based semiconductor light-emitting elements and illuminating devices of the first and second embodiments and the liquid crystal display device of the third embodiment in that the nitride-based semiconductor light-emitting element has an active layer region whose principal surface is a plane slanted from an m plane by an angle of 1° or more. This embodiment is described below with reference to the nitride-based semiconductor light-emitting element of the first embodiment. The illuminating device and liquid crystal display device of this embodiment, as well as the nitride-based semiconductor light-emitting element of this embodiment, have an active layer region whose principal surface is slanted in a manner described below.

As described in the first embodiment with reference to FIG. 3, the nitride-based semiconductor multilayer structure 20 which includes the active layer region 24 is formed through epitaxial growth on the GaN substrate 10. In order to grow the active layer region 24 whose principal surface is at an angle of 1° or more with an m plane, the nitride-based semiconductor light-emitting element of this embodiment may have the principal surface of the GaN substrate 10 of FIG. 3 that is slant from an m plane by an angle of 1° or more. The GaN substrate 10 of this kind is called in general an "off substrate". An off substrate can be manufactured by using as the principal surface a plane that is intentionally slanted from an m plane in a particular direction in the process of slicing a substrate out of a single-crystal ingot and polishing a surface of the substrate. Various semiconductor layers stacked on the thus slanted principal surface of the substrate also have surfaces (principal surfaces) slanted from the m plane.

Accordingly, in the nitride-based semiconductor light-emitting element of this embodiment, too, the active layer region 24, the first conductivity-type semiconductor layer 22, and the second conductivity-type semiconductor layer 26 which are included in the nitride-based semiconductor multilayer structure 20 each have a principal surface that is at an angle of 1° or more with an m plane. The GaN substrate 10 may be replaced by, for example, a sapphire substrate or an SiC substrate whose principal surface is a plane slanted from an m plane in a particular direction.

Figure 20:
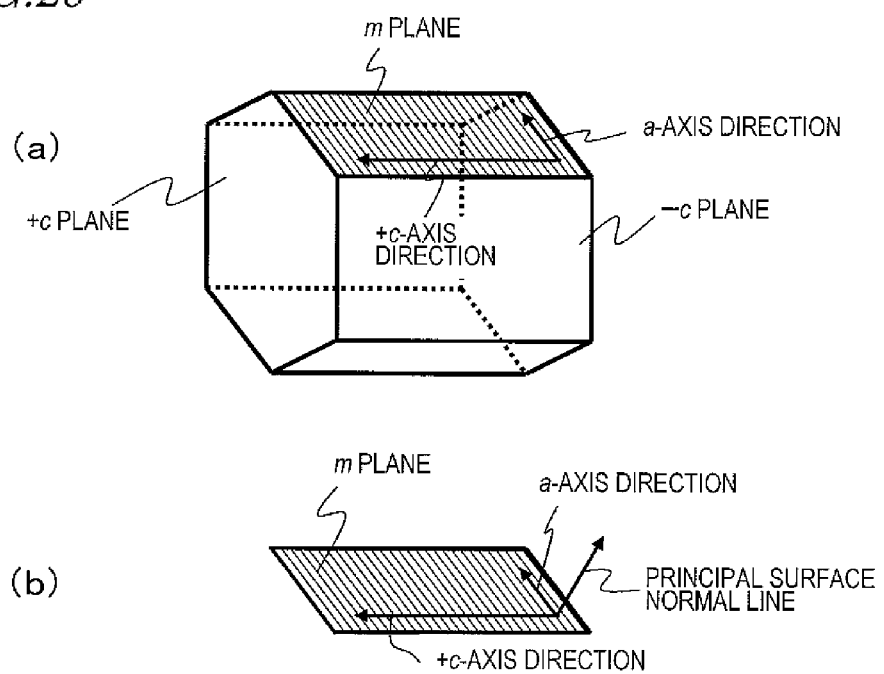
FIG. 20(*a*) is a diagram schematically illustrating the crystal structure of a GaN-based compound semiconductor and FIG. 20(*b*) is a perspective view illustrating a correlation among the normal line of an m plane, a +c-axis direction, and an a-axis direction.

The slant of the active layer region in this embodiment is described next in detail with reference to FIGS. 20 (a) and 20(b).

FIG. 20(a) is a diagram schematically illustrating the crystal structure (wurtzite crystal structure) of a GaN-based compound semiconductor, and illustrates a structure that is obtained by rotating the direction of the crystal structure of FIG. 2(a) by 90°. A GaN crystal has c planes which include a +c plane and a −c plane. The +c plane is a (0001) plane in which Ga atoms appear on the surface and is called a "Ga plane". The −c plane is a (000-1) plane in which nitrogen (N) atoms appear on the surface and is called an "N plane". The +c plane and the −c plane are parallel to each other and are both perpendicular to the m plane. Having polarities, c planes can thus be divided into a +c plane and a −c plane, whereas there is no sense in distinguishing a planes, which are non-polarity planes, between a +a plane and a −a plane.

A +c-axis direction of FIG. 20(a) is a direction that runs perpendicularly from the −c plane to the +c plane. An a-axis direction, on the other hand, corresponds to the basis vector $a_2$ of FIG. 1, and is in a [−12-10] direction parallel to the m plane. FIG. 20(b) is a perspective view illustrating a correlation among the normal line of the m plane, the +c-axis direction, and the a-axis direction. The normal line of the m plane is parallel to a [−10-10] direction and, as illustrated in FIG. 20(b), is perpendicular to the +c-axis direction and the a-axis direction both.

That the principal surface of a GaN-based compound semiconductor layer is at an angle of 1° or more with an m plane means that the normal line of the principal surface of this semiconductor layer is at an angle of 1° or more with the normal line of the m plane.

Next, a reference is made to FIGS. 21(a) and 21(b). FIGS. 21(a) and 21(b) are each a sectional view illustrating a relation between the principal surface of a GaN-based compound semiconductor layer and an m plane. This is a sectional view perpendicular to both the m plane and c planes. An arrow indicating the +c-axis direction is shown in FIGS. 21(a) and 21(b). As illustrated in FIGS. 21(a) and 21(b), the m plane is parallel to the +c-axis direction. A normal vector of the m plane is therefore perpendicular to the +c-axis direction.

In the examples of FIGS. 21(a) and 21(b), a normal vector of the principal surface in the GaN-based compound semiconductor layer is slanted in a c-axis direction from the normal vector of the m plane. To describe in more detail, the normal vector of the principal surface is slanted on the side of the +c plane in the example of FIG. 21(a), whereas the normal vector of the principal surface is slanted on the side of the −c plane in the example of FIG. 21(b). The slant angle of the normal vector of the principal surface with respect to the normal vector of the m plane (slant angle θ) herein takes a positive value in the former example, and a negative value in the latter example. It can be said in both cases that the principal surface is slanted in a c-axis direction.

Figure 22:
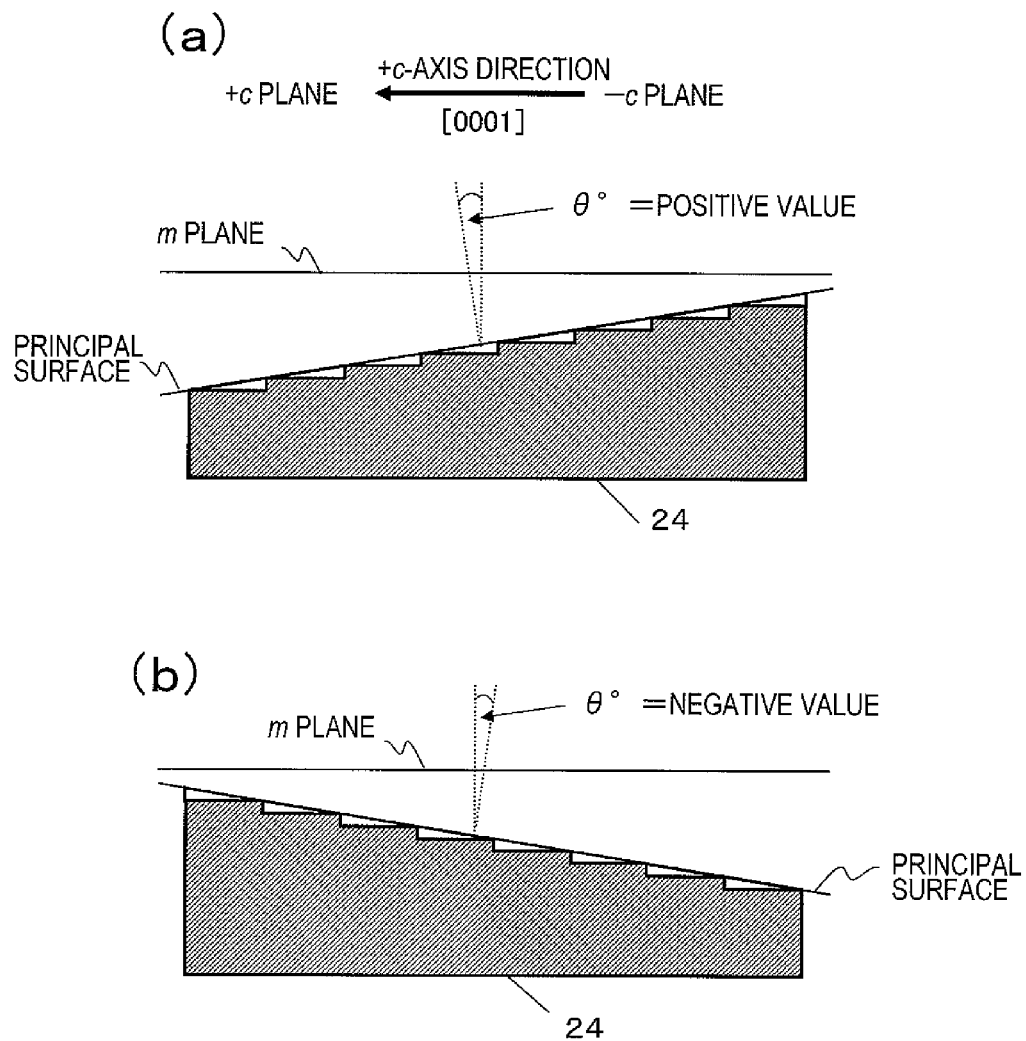
FIGS. 22(*a*) and 22(*b*) are each a diagram schematically illustrating in section a region near the principal surface of an active layer region 24 in a fourth embodiment.

In this embodiment, when the slant angle of the principal surface of the active layer region 24 is within a range of 1° or more and 5° or less, and when the slant angle is within a range of −5° or more and −1° or less, the effects of the present disclosure are brought out as in the case where the slant angle is more than 0° and less than ±1°. The reason for this is described below with reference to FIGS. 22(a) and 22(b). FIGS. 22(a) and 22(b) are sectional views corresponding to FIGS. 21(a) and 21(b), respectively, and each illustrate a region near the principal surface in the active layer region 24 that is slanted from the m plane in a c-axis direction. When the absolute value of the slant angle θ is 5° or less, a plurality of steps are formed in the principal surface of the active layer region 24 as illustrated in FIGS. 22(a) and 22(b). The steps each have a height (2.7 Å) equal to the thickness of a monoatomic layer, and are aligned parallel to one another at substantially equal intervals (30 Å or more). This arrangement of steps overall forms a principal surface that is slanted from the m plane, but is microscopically viewed as a large number of exposed m-plane regions. The active layer region 24 whose principal surface is slanted from an m plane takes this structure because an m plane is very stable as a crystal plane in the first place.

The active layer region 24 whose principal surface is slanted from an m plane has the same structure also when the normal vector of the principal surface is slanted in other plane orientations than the +c plane and −c plane orientations. It is regarded that the same is true even when the normal vector of the principal surface is slanted in, for example, an a-axis direction if the slant angle is within a range of 1° or more and 5° or less.

Accordingly, in the case where the active layer region 24 has the principal surface that is slant at an angle of 1° or more and 5° or less from an m plane in any direction, the semiconductor chip may be thick so as to realize polarized light in a direction parallel to the a axis and to enhance the mechanical strength of the semiconductor chip, as described in detail in the first to third embodiments. The thickness of the semiconductor chip at which the optical polarization ratio starts to decrease is greater when the light emission wavelength is longer.

When the absolute value of the slant angle θ is more than 5°, the internal quantum efficiency drops due to a piezo-electric field. If the generated piezo-electric field is prominent, the point of realizing a semiconductor light-emitting element through m-plane growth consequently diminishes. The present disclosure therefore limits the absolute value of the slant angle θ to 5° or less. However, even with the slant angle θ set to, for example, 5°, the actual slant angle θ can deviate from 5° by about ±1° due to fluctuations in manufacture. Eradicating such fluctuations in manufacture completely is difficult and an angle deviation this minute does not impair the effects of the present disclosure.

According to the present disclosure, an optical polarization ratio satisfactory for an illuminating device is accomplished while the ratio of chips broken in dicing and packaging is lowered. A GaN-based semiconductor light-emitting element formed by crystal growth on an m-plane substrate, which has not been used extensively because of poor mechanical strength, can therefore be put into use as a light source in various fields. In addition, an illuminating device and a liquid crystal display device that utilize optical polarization characteristics and are high in efficiency and low in cost are realized.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. An illuminating device comprising at least a first nitride-based semiconductor light-emitting element and a second nitride-based semiconductor light-emitting element,
   wherein the first nitride-based semiconductor light-emitting element and the second nitride-based semiconductor light-emitting element each comprise a semiconductor chip,
   wherein the semiconductor chip comprises a nitride-based semiconductor multilayer structure formed from an $Al_xIn_yGa_zN$ (x+y+z=1, x≥0, y≥0, z≥0) semiconductor, and the nitride-based semiconductor multilayer structure comprises an active layer region formed from a nitride semiconductor layer,
   wherein the $Al_xIn_yGa_zN$ (x+y+z=1, x≥0, y≥0, z≥0) semiconductor is a GaN-based semiconductor,
   wherein the active layer region is at an angle of 1° or more with an m plane, and an angle formed by a normal line of a principal surface in the active layer region and a normal line of the m plane is 1° or more and 5° or less,
   wherein the first nitride-based semiconductor light-emitting element and the second nitride-based semiconductor light-emitting element each emit polarized light from the active layer region, and
   wherein, when the polarized light emitted from the first nitride-based semiconductor light-emitting element and the polarized light emitted from the second nitride-based semiconductor light-emitting element have wavelengths λ1 and λ2, respectively, and thicknesses of the semiconductor chips of the first nitride-based semiconductor light-emitting element and the second nitride-based semiconductor light-emitting element are given as d1 and d2, respectively, the following relations are satisfied:

$\lambda 1 < \lambda 2;$ $d1 < d2;$ 420 nanometers≤λ1≤470 nanometers; and
   110 micrometers≤d1 ≤150 micrometers;
   wherein an optical polarization ratio of the first nitride-based semiconductor light-emitting element is not less than 0.9, and
   wherein an optical polarization ratio of the second nitride-based semiconductor light-emitting element is not less than 0.9.

2. The illuminating device of claim 1, wherein the active layer region is slanted in a c-axis direction or an a-axis direction.

3. The illuminating device of claim 1, further comprising a third nitride-based semiconductor light-emitting element which comprises the semiconductor chip,
   wherein, when the third nitride-based semiconductor light-emitting element emits polarized light that has a wavelength of λ3 and has a semiconductor chip thickness of d3, the following relations are satisfied:

$\lambda 1 < \lambda 2 < \lambda 3;$ and $d1 < d2 < d3,$ and wherein an optical polarization ratio of the third nitride-based semiconductor light-emitting element is not less than 0.9.

4. The illuminating device of claim 3, wherein the polarized light emitted from the first nitride-based semiconductor light-emitting element, the polarized light emitted from the second nitride-based semiconductor light-emitting element, and the polarized light emitted from the third nitride-based semiconductor light-emitting element have the same optical polarization direction.

5. The illuminating device of claim 3, further comprising a support substrate,
   wherein the first nitride-based semiconductor light-emitting element, the second nitride-based semiconductor light-emitting element, and the third nitride-based semiconductor light-emitting element are supported on the support substrate.

6. The illuminating device of claim 3, wherein the wavelengths $\lambda 1$, $\lambda 2$, and $\lambda 3$ are a blue-range wavelength, a green-range wavelength, and a red-range wavelength, respectively.

7. The illuminating device of claim 3, wherein the following relations are satisfied:
   520 nanometers $\leq \lambda 2 \leq$ 560 nanometers;
   200 micrometers $\leq d2 \leq$ 240 micrometers;
   590 nanometers $\leq \lambda 3 \leq$ 660 nanometers; and
   250 micrometers $\leq d3 \leq$ 290 micrometers.

8. The illuminating device of claim 1, wherein the following relations are satisfied:
   520 nanometers $\leq \lambda 2 \leq$ 560 nanometers; and
   200 micrometers $\leq d2 \leq$ 240 micrometers.

9. The illuminating device of claim 1, further comprising:
   an AlGaInP-based light-emitting element; and
   a polarizing filter provided in a place that allows the polarizing filter to transmit light emitted from the AlGaInP-based light-emitting element,
   wherein the wavelength $\lambda 2$ is a green-range wavelength.

10. The illuminating device of claim 9, wherein the following relation is satisfied:
   200 micrometers $\leq d2 \leq$ 240 micrometers.

11. The illuminating device of claim 9, wherein the following relation is satisfied:
   520 nanometers $\leq \lambda 2 \leq$ 560 nanometers.

12. The illuminating device of claim 1, wherein the first nitride-based semiconductor light-emitting element and the second nitride-based semiconductor light-emitting element each comprise a p-type electrode which is provided in a part of the nitride-based semiconductor multilayer structure and which is formed from Mg or a Mg alloy.

13. The illuminating device of claim 1, further comprising a first optical lens which collects the polarized light emitted from the first nitride-based semiconductor light-emitting element and a second optical lens which collects the polarized light emitted from the second nitride-based semiconductor light-emitting element.

14. The illuminating device of claim 13, wherein the first and second optical lenses collimate light beams emitted from the nitride-based semiconductor light-emitting elements into parallel beams.

15. The illuminating device of claim 14, wherein the first nitride-based semiconductor light-emitting element and the second nitride-based semiconductor light-emitting element each have a light emission face positioned near a focal point of the optical lens.

16. The illuminating device of claim 1, further comprising an optical lens which collects in common the polarized light emitted from the first nitride-based semiconductor light-emitting element and the polarized light emitted from the second nitride-based semiconductor light-emitting element.

17. The illuminating device of claim 1, wherein the semiconductor chip comprises a substrate formed from a GaN-based semiconductor that has an m plane as a surface.

18. An illuminating device comprising:
   a plurality of the illuminating devices of claim 12;
   an optical sheet; and
   an optical plate.

19. A liquid crystal display device comprising:
   a liquid crystal panel; and
   the illuminating device of claim 17.

20. A method of manufacturing an illuminating device that comprises at least a first nitride-based semiconductor light-emitting element and a second nitride-based semiconductor light-emitting element, comprising the steps of:
   (A) manufacturing the first nitride-based semiconductor light-emitting element and the second nitride-based semiconductor light-emitting element, which differ from each other in light emission wavelength and in semiconductor chip thickness, the step (A) comprising the steps of:
      (a) preparing a substrate;
      (b) forming on the substrate a nitride-based semiconductor multilayer structure, which comprises an active layer region formed from a nitride semiconductor layer and which is formed from an $Al_xIn_yGa_zN$ (x+y+z=1, x≤0, y≤0, z≤0) semiconductor, and slanting the active layer region from an m plane by an angle of 1° or more so that an angle formed by a normal line of a principal surface in the active layer region and a normal line of the m plane is 1° or more and 5° or less;
      (c) forming an electrode in the nitride-based semiconductor multilayer structure to produce a semiconductor chip that emits polarized light from the active layer region; and
      (d) adjusting the semiconductor chip to a thickness that is determined by a wavelength of the polarized light emitted from the active layer region; and
   (B) disposing the first nitride-based semiconductor light-emitting element and the second nitride-based semiconductor light-emitting element on a support substrate,
      wherein the $Al_xIn_yGa_zN$ (x+y+z=1, x≤0, y≤0, z≤0) semiconductor is a GaN-based semiconductor,
   wherein, in the step (d) of the step (A), when the polarized light emitted from the first nitride-based semiconductor light-emitting element and the polarized light emitted from the second nitride-based semiconductor light-emitting element have wavelengths $\lambda 1$ and $\lambda 2$, respectively, and thicknesses of the semiconductor chips of the first nitride-based semiconductor light-emitting element and the second nitride-based semiconductor light-emitting element are given as d1 and d2, respectively, the thicknesses of the semiconductor chips of the first nitride-based semiconductor light-emitting element and the second nitride-based semiconductor light-emitting element are adjusted in a manner that satisfies the following relations:

$\lambda 1 < \lambda 2$;

$d1 < d2$;

420 nanometers $\leq \lambda 1 \leq$ 470 nanometers; and
   110 micrometers $\leq d1 \leq$ 150 micrometers;
   wherein an optical polarization ratio of the first nitride-based semiconductor light-emitting element is not less than 0.9, and wherein an optical polarization ratio of the second nitride-based semiconductor light-emitting element is not less than 0.9.

21. The method of manufacturing an illuminating device of claim 20, wherein the active layer region is slanted in a c-axis direction or an a-axis direction.

22. The method of manufacturing an illuminating device of claim 21, wherein, in the step (B), the first nitride-based semiconductor light-emitting element and the second nitride-based semiconductor light-emitting element are disposed on the support substrate so that the polarized light emitted from the first nitride-based semiconductor light-emitting element and the polarized light emitted from the second nitride-based semiconductor light-emitting element have the same optical polarization direction.

23. The method of manufacturing an illuminating device of claims 20, wherein the substrate comprises a GaN-based semiconductor that has an m plane as a surface.

* * * * *